United States Patent
Nam

(10) Patent No.: US 9,664,996 B2
(45) Date of Patent: May 30, 2017

(54) PHOTOMASKS FOR REDUCING THERMAL STRESS GENERATED BY HEAT

(71) Applicant: SK Hynix Inc., Icheon (KR)

(72) Inventor: Byung Ho Nam, Daegu (KR)

(73) Assignee: SK HYNIX INC., Icheon (KR)

( * ) Notice: Subject to any disclaimer, the term of this patent is extended or adjusted under 35 U.S.C. 154(b) by 188 days.

(21) Appl. No.: 14/742,394

(22) Filed: Jun. 17, 2015

(65) Prior Publication Data

US 2016/0246166 A1 Aug. 25, 2016

(30) Foreign Application Priority Data

Feb. 24, 2015 (KR) .................. 10-2015-0025835

(51) Int. Cl.
*G03F 1/26* (2012.01)
*G03F 1/38* (2012.01)
*G03F 1/54* (2012.01)

(52) U.S. Cl.
CPC .................. *G03F 1/26* (2013.01); *G03F 1/38* (2013.01); *G03F 1/54* (2013.01)

(58) Field of Classification Search
CPC .................. G03F 1/26; G03F 1/38; G03F 1/54
USPC ............................................... 430/5
See application file for complete search history.

(56) References Cited

FOREIGN PATENT DOCUMENTS

KR 10-2011-0001144 A 1/2011

*Primary Examiner* — Christopher Young

(57) ABSTRACT

A photomask includes a light transmission substrate having a transfer region and a frame region, a light-transmitting region exposing a portion of the light transmission substrate in the transfer region corresponding to a transfer pattern, and a light-blocking region disposed in the transfer region and surrounding the light-transmitting region, wherein the light-blocking region includes a first light-blocking region surrounding the light-transmitting region, and a second light-blocking region that surrounds the first light-blocking region, and wherein a first light-blocking pattern is disposed on the light transmission substrate in the first light-blocking region, and a plurality of second light-blocking patterns are disposed on the light transmission substrate in the second light-blocking region.

21 Claims, 20 Drawing Sheets

☐ : LIGHT-TRANSMITTING REGION  
▨ : LIGHT-BLOCKING REGION  } TRANSFER REGION

▨ : FRAME REGION

☐ : LIGHT-TRANSMITTING REGION ⎫ TRANSFER
⋮ : PHASE SHIFT REGION ⎬ REGION
▨ : FRAME REGION

US 9,664,996 B2

1

PHOTOMASKS FOR REDUCING THERMAL STRESS GENERATED BY HEAT

CROSS-REFERENCE TO RELATED APPLICATIONS

The present application claims priority under 35 U.S.C 119(a) to Korean Application No. 10-2015-0025835, filed on Feb. 24, 2015, in the Korean intellectual property Office, which is incorporated herein by reference in its entirety as set forth in full.

BACKGROUND

1. Technical Field

Various embodiments of the present disclosure relate to photomasks used in lithography processes and, more particularly, to photomasks for reducing thermal stress generated by heat.

2. Related Art

In general, a semiconductor device may include a plurality of patterns disposed over a semiconductor substrate. The patterns may be formed using a photolithography process and an etch process to realize active elements and/or passive elements. The photolithography process may be used to form photoresist patterns. More specifically, the photolithography process may be performed by coating a photoresist material on a target layer to form a photoresist layer, by selectively exposing portions of the photoresist layer to light with a photomask, and by developing the exposed photoresist layer to form the photoresist patterns. The photoresist patterns may be used as etch masks for patterning the target layer. As such, the photomask may be used to transfer predetermined patterns onto the photoresist layer and may be generally comprised of a light transmission substrate and a plurality of transfer patterns disposed on the light transmission substrate.

SUMMARY

Various embodiments are directed to photomasks for reducing thermal stress generated by heat.

According to an embodiment, a photomask includes a light transmission substrate having a transfer region and a frame region, a light-transmitting region exposing a portion of the light transmission substrate in the transfer region corresponding to a transfer pattern, and a light-blocking region disposed in the transfer region and surrounding the light-transmitting region, wherein the light-blocking region includes a first light-blocking region surrounding the light-transmitting region, and a second light-blocking region that surrounds the first light-blocking region, and wherein a first light-blocking pattern is disposed on the light transmission substrate in the first light-blocking region, and a plurality of second light-blocking patterns are disposed on the light transmission substrate in the second light-blocking region.

According to another embodiment, a photomask includes a light transmission substrate having a transfer region and a frame region, a light-transmitting region exposing a portion of the light transmission substrate in the transfer region corresponding to a transfer pattern, and a phase shift region surrounding the light-transmitting region in the transfer region, wherein the phase shift region includes a first phase shift region surrounding the light-transmitting region and a second phase shift region surrounding the first phase shift region, and wherein a first phase shift pattern is disposed on the light transmission substrate in the first phase shift region,

2 and a plurality of second phase shift patterns are disposed on the light transmission substrate in the second phase shift region.

According to another embodiment, a photomask includes a light transmission substrate having a transfer region and a frame region, a transfer pattern disposed on a portion of the light transmission substrate in the transfer region, and a light-transmitting region surrounding the transfer pattern in the transfer region, wherein the light-transmitting region includes a first light-transmitting region surrounding the transfer pattern and a second light-transmitting region surrounding the first light-transmitting region, wherein the light transmission substrate in the first light-transmitting region is exposed, wherein a plurality of light-blocking patterns are disposed on the light transmission substrate in the second light-transmitting region, and wherein each of the plurality of light-blocking patterns has a closed loop shape.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
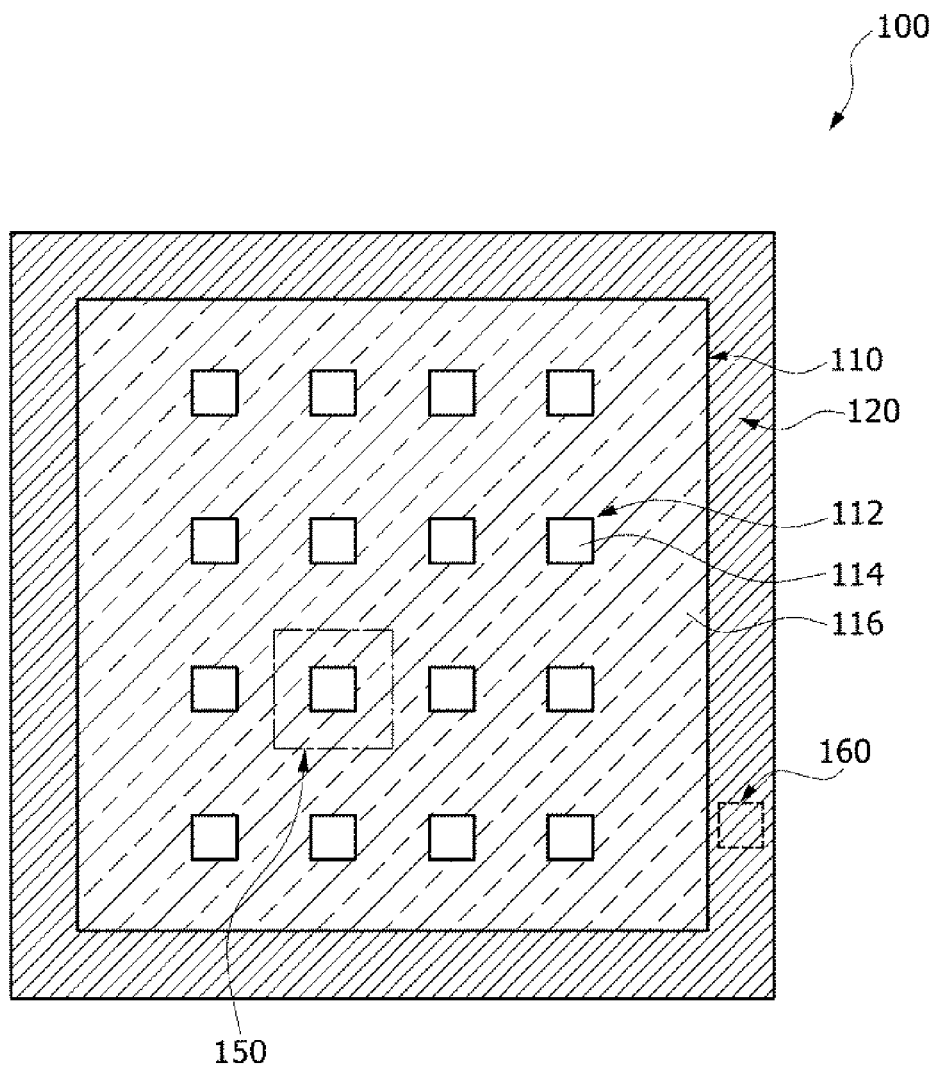
FIG. 1 is a plan view illustrating a binary photomask according to an embodiment.

In a photolithography process, light having a specific wavelength may be emitted from a light source and may irradiate a photoresist layer formed on a wafer through a photomask. Light-blocking regions of the photomask may prevent the light from irradiating the photoresist layer on the wafer, and only light-transmitting regions of the photomask may allow the light to reach the wafer. The light-blocking regions may be regions on which light-blocking patterns are disposed. During the photolithography process, the light-blocking patterns may absorb a large amount of optical energy of the light irradiating the photomask, thereby generating heat in the photomask. The heat may be conducted to a light transmission substrate of the photomask, and thus the light transmission substrate may be expanded and deformed due to the heat. The thermal deformation of the light transmission substrate may change position coordinates of patterns of the photomask, and thus cause an overlay error between the photomask and the wafer in an exposure step.

In addition, the light penetrating the photomask may pass through a plurality of lenses constituting a lens module of an exposure system to reach the wafer. Thus, the plurality of lenses may also absorb the optical energy of the light emitted from the light source to generate heat therein. As a result, the plurality of lenses may be expanded, and thus distort a phase of the light passing through the lenses. This may lead to an abnormal lithography process.

The following embodiments may provide photomasks which are capable of substantially preventing the light emitted from the light source from being absorbed into transfer patterns such as light-blocking patterns or phase shift patterns of the photomasks during a photolithography process. Moreover, the following embodiments may provide photomasks which may substantially prevent generation of thermal stress of lenses in an exposure system by reducing an amount of the light which irradiates the lenses through light-transmitting regions of the photomasks.

It will be understood that although the terms first, second, third, etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present.

FIG. 1 is a plan view illustrating a binary photomask 100 according to an embodiment. In FIG. 1, a configuration for relieving thermal stress of the binary photomask 100 according to the present embodiment is not illustrated in order to reduce the complexity of the drawing. The configuration for relieving the thermal stress of the binary photomask 100 according to the present embodiment will be described in detail with reference to FIGS. 2 to 5. In addition, various configurations for relieving thermal stress of photomasks according to other embodiments will be described in detail with reference to FIGS. 6 to 8.

Referring to FIG. 1, the binary photomask 100 may have a transfer region 110 and a frame region 120 surrounding the transfer region 110. The transfer region 110 may correspond to a region in which patterns configured to be transferred onto a wafer are disposed. The frame region 120 may correspond to a marginal region which is provided to prevent process errors that are due to double exposures between two adjacent shot areas defined in an exposure step. The two adjacent shot areas may be two adjacent chip areas.

A plurality of transfer patterns 112 may be disposed in the transfer region 110. The plurality of transfer patterns 112 may be two-dimensionally arrayed in rows and columns and spaced apart from each other. In the present embodiment, the plurality of transfer patterns 112 may have a uniform size and may be uniformly spaced apart from each other. However, in some embodiments, sizes of the plurality of transfer patterns 112 may be nonuniform and/or distances between the plurality of transfer patterns 112 may be nonuniform. In either embodiment, the configuration for relieving thermal stress of the binary photomask 100 according to the present embodiment may be equally applicable.

As illustrated in FIG. 1, each of the transfer patterns 112 may be a hole-shaped pattern. However, the type of the transfer patterns 112 illustrated in FIG. 1 is merely exemplary. For example, the transfer patterns 112 can be line patterns spaced apart from each other instead of hole-shaped patterns. Although FIG. 1 illustrates the transfer patterns 112 each having a rectangular shape, embodiments are not limited thereto. In some embodiments, the transfer patterns 112 may have non-rectangular shapes. Each of the transfer patterns 112 may correspond to a light-transmitting region 114 which is comprised of a portion of a light transmission substrate exposed by an opening in a light-blocking region 116. That is, the transfer region 110 may include the light-transmitting regions 114 corresponding to the transfer patterns 112 and the light-blocking region 116 surrounding the light-transmitting regions 114 in a plan view.

A configuration of the light-blocking region 116 will be described more fully with reference to FIGS. 2 and 3, which illustrate in detail a portion 150 of the transfer region 110 included in the binary photomask 100. A light-blocking pattern such as a chromium (Cr) pattern may be disposed in the frame region 120. Thus, the frame region 120 may substantially block light during an exposure step.

The transfer patterns 112 disposed in the transfer region 110 may be transferred onto a wafer by an exposure step. In particular, the transfer patterns 112 corresponding to the light-transmitting regions 114 may be transferred onto a positive tone resist layer formed on the wafer. Specifically, if an exposure step is performed with the binary photomask 100, portions of the positive tone resist layer that correspond to the transfer patterns 112 may be exposed to light passing through the transfer patterns 112 disposed in the transfer region 110 of the binary photomask 100. Light may not irradiate the remaining portion of the positive tone resist layer that corresponds to the light-blocking region 116 of the transfer region 110. As a result of the exposure step, a chemical structure of the exposed portions of the positive tone resist layer may change. Thus, the exposed portions of the positive tone resist layer may be selectively dissolved by a developer, and the transfer patterns 112 of the binary photomask 100 are transferred onto the positive tone resist layer.

Figure 2:
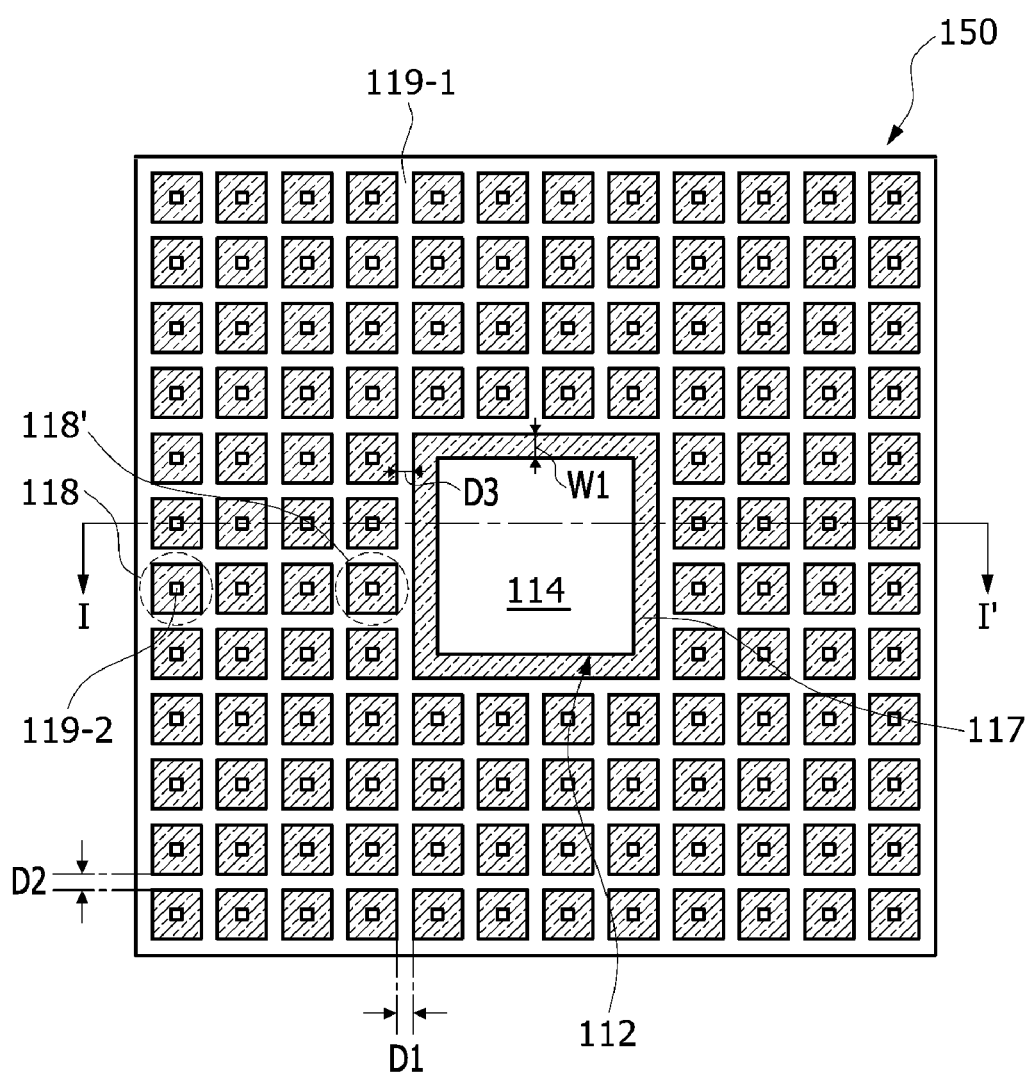
FIG. 2 is an enlarged view illustrating a portion of a transfer region of the binary photomask shown in FIG. 1.
Figure 3:
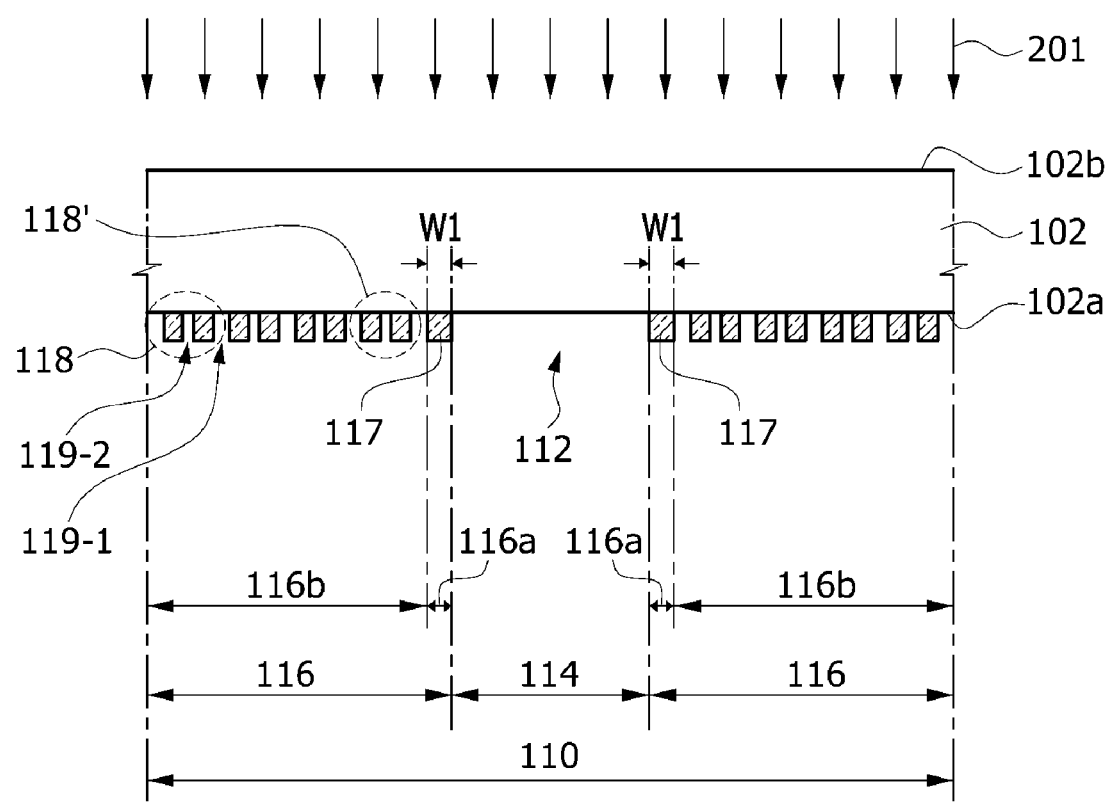
FIG. 3 is a cross-sectional view taken along a line I-I' of FIG. 2.

FIG. 2 is an enlarged view illustrating the portion 150 of the transfer region 110 of the binary photomask 100 shown in FIG. 1, and FIG. 3 is a cross-sectional view taken along a line I-I' of FIG. 2. In FIGS. 2 and 3, the same reference numerals as used in FIG. 1 denote the same elements. Referring to FIGS. 1, 2 and 3, the transfer patterns 112 may correspond to the light-transmitting regions 114, which are comprised of portions of a light transmission substrate 102 that are exposed in the transfer region 110. The light-transmitting regions 114 may be surrounded by the light-blocking region 116.

A top surface 102a of the light transmission substrate 102 in each light-transmitting region 114 may be exposed. Thus, during the exposure step, the light irradiating a bottom surface 102b of the light transmission substrate 102 may penetrate the light transmission substrate 102 in the light-transmitting region 114 to reach a wafer through the top surface 102a of the light transmission substrate 102 and a lens module (not shown) of an exposure system.

The light-blocking region 116 surrounding the light-transmitting regions 114 may include a plurality of first light-blocking region 116a and a second light-blocking region 116b. Each of the first light-blocking regions 116a may have a uniform width W1 along a perimeter of a corresponding one of the light-transmitting regions 114 and surround the corresponding light-transmitting region 114. In each of the first light-blocking regions 116a, a first light-blocking pattern 117 may be disposed on the top surface 102a of the light transmission substrate 102.

The second light-blocking region 116b may correspond to a region between the first light-blocking regions 116a in the light-blocking region 116. That is, the transfer region 110 may include the light-transmitting regions 114 corresponding to the transfer patterns 112, the first light-blocking regions 116a surrounding the light-transmitting regions 114, respectively, and the second light-blocking region 116b disposed between the first light-blocking regions 116a to surround the first light-blocking regions 116a.

A plurality of second light-blocking patterns 118 may be two-dimensionally arrayed along rows and columns in the second light-blocking region 116b and spaced apart from each other in a plan view. The top surface 102a of the light transmission substrate 102 may be partially exposed by the second light-blocking patterns 118. In the present embodiment, the exposed portion of the light transmission substrate 102 between the second light blocking patterns 118 may be a first exposure region 119-1. A distance D1 between the second light-blocking patterns 118 arrayed in each row may be substantially equal to a distance D2 between the second light-blocking patterns 118 arrayed in each column.

Second light-blocking patterns 118' may be second light-blocking patterns 118 may include second light-blocking patterns 118' disposed directly adjacent to each of the first light-blocking patterns 117. The term "directly adjacent" refers to a member of a group that is the closest member of the group to another structure. A first structure that is "directly adjacent" to a second structure does not necessarily touch the second structure. A distance D3 between the first light-blocking pattern 117 and any one of the second light-blocking patterns 118' may be substantially equal to the distance D1 between the second light-blocking patterns 118 arrayed in each row and the distance D2 between the second light-blocking patterns 118 arrayed in each column. The second light-blocking patterns 118 may be located at cross points of the rows and the columns. That is, the second light-blocking patterns 118 may be two-dimensionally arrayed in a matrix form.

Each of the second light-blocking patterns 118 may have a rectangular closed loop shape. That is, each of the second light-blocking patterns 118 may have an opening that penetrates a central portion thereof. Accordingly, portions of the top surface 102a of the light transmission substrate 102 may be exposed by the openings of the second light-blocking patterns 118. In the present embodiment, the portions of the light transmission substrate 102 exposed by the openings of the second light-blocking patterns 118 may be second exposure regions 119-2. Thus, the light-blocking region 116 in the transfer region 110 may include light-blocking regions covered with the first and second light-blocking patterns 117 and 118 and light-transmitting regions comprised of the first and second exposure regions 119-1 and 119-2.

If the exposure step is performed with an exposure system in which the binary photomask 100 is loaded, light 201 irradiating the bottom surface 102b of the light transmission substrate 102 may penetrate the light transmission substrate 102 and may exit out of the light transmission substrate 102 through the top surface 102a of the light transmission substrate 102. The light 201 exiting out of the light transmission substrate 102 may irradiate the positive tone resist layer formed on the wafer through the lens module of the exposure system. Since the light 201 penetrating the light-transmitting regions 114 irradiates the positive tone resist layer formed on the wafer, the transfer patterns 112 may be transferred onto the positive tone resist layer. Most of the light 201 irradiating the first and second light-blocking patterns 117 and 118 in the light-blocking region 116 may be blocked from reaching the positive tone resist layer formed on the wafer.

Meanwhile, the light 201 irradiating the first and second exposure regions 119-1 and 119-2 in the light-blocking region 116 may penetrate the light transmission substrate 102 and may exit out of the light transmission substrate 102 through the top surface 102a of the light transmission substrate 102. However, in an embodiment, the first and second exposure regions 119-1 and 119-2 may have widths that are narrower than a resolution limit of the exposure system. Thus, undesired patterns corresponding to the first and second exposure regions 119-1 and 119-2 may not be transferred onto the positive tone resist layer formed on the wafer, and the light 201 exiting out of the first and second exposure regions 119-1 and 119-2 may not influence the transfer of the transfer patterns 112 corresponding to the light-transmitting regions 114.

According to the above embodiment, an amount of the light absorbed into the binary photomask 100 may be reduced by an amount of the light penetrating the light transmission substrate 102 in the first and second exposure regions 119-1 and 119-2, as compared to a case in which an entire portion of the light-blocking region 116 is fully covered with a light-blocking layer. This may reduce thermal stress of the binary photomask 100 that is due to heat generated by the light absorbed into the binary photomask 100 during the exposure step. As a result, deformation of the binary photomask 100 may be suppressed, thus substantially preventing positions or shapes of the overlay patterns in the binary photomask 100 from being changed.

Figure 4:
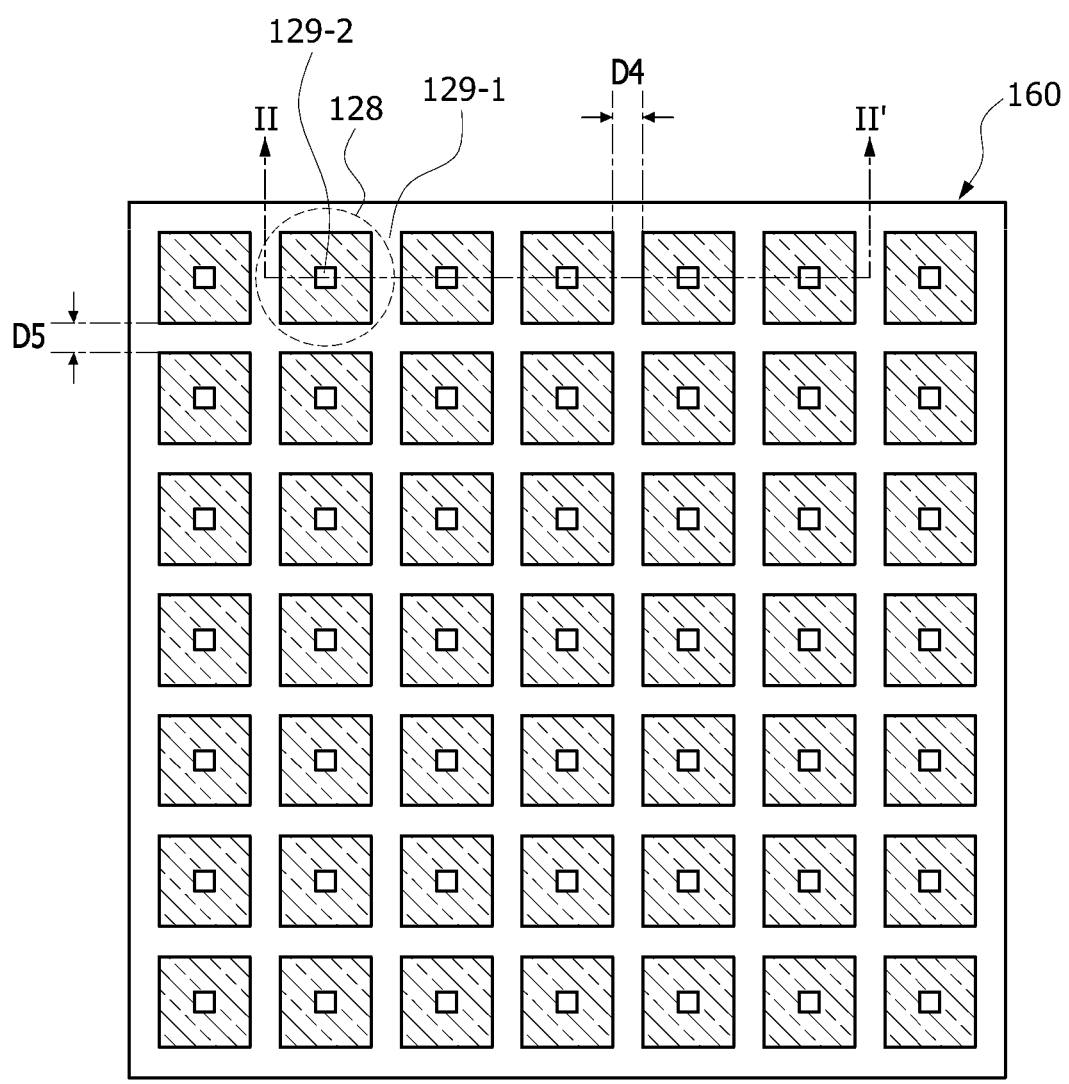
FIG. 4 is an enlarged view illustrating a portion of a frame region of the binary photomask shown in FIG. 1.
Figure 5:
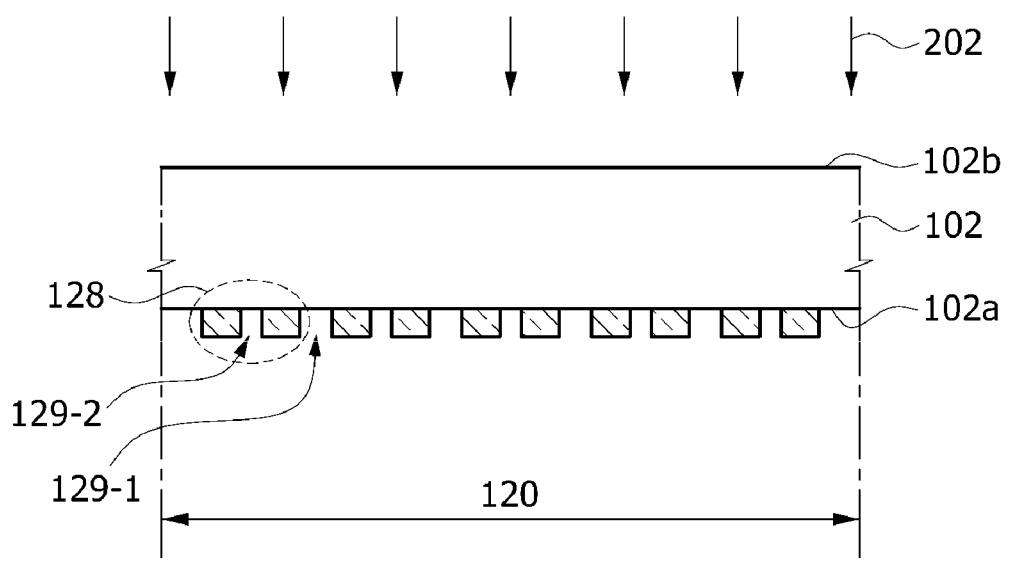
FIG. 5 is a cross-sectional view taken along a line II-II' of FIG. 4.

FIG. 4 is an enlarged view illustrating a portion 160 of the frame region 120 of the binary photomask 100 shown in FIG. 1, and FIG. 5 is a cross-sectional view taken along a line II-II' of FIG. 4. In FIGS. 4 and 5, the same reference numerals as used in FIG. 1 denote the same elements. Referring to FIGS. 1, 4 and 5, a plurality of frame light-blocking patterns 128 may be two-dimensionally arrayed on the top surface 102a of the light transmission substrate 102 and spaced apart from each other. That is, the plurality of frame light-blocking patterns 128 may be disposed in rows and columns in a plan view. The top surface 102a of the light transmission substrate 102 may be exposed between the frame light-blocking patterns 128. In the present embodiment, the exposed portion of the light transmission substrate 102 between the frame light blocking patterns 128 may be a first frame exposure region 129-1.

A distance D4 between the frame light-blocking patterns 128 arrayed in each row may be substantially equal to a distance D5 between the frame light-blocking patterns 128 arrayed in each column. These distances D4 and D5 may be substantially equal to the distance D1 between the second light-blocking patterns 118 arrayed in each row and the distance D2 between the second light-blocking patterns 118 arrayed in each column which are described with reference to FIGS. 2 and 3. The frame light-blocking patterns 128 may be located at cross points of the rows and the columns. That is, the frame light-blocking patterns 128 may be two-dimensionally arrayed in a matrix form.

Each of the frame light-blocking patterns 128 may have a rectangular closed loop shape. That is, each of the frame light-blocking patterns 128 may have an opening that penetrates a central portion thereof. Accordingly, portions of the top surface 102a of the light transmission substrate 102 may be exposed by the openings of the frame light-blocking patterns 128. In the present embodiment, the portions of the light transmission substrate 102 exposed by the openings of the frame light-blocking patterns 128 may be second frame exposure regions 129-2. Thus, the frame region 120 may include light-blocking regions covered with the frame light-blocking patterns 128 and light-transmitting regions comprised of the first and second frame exposure regions 129-1 and 129-2.

If an exposure step is performed with the exposure system in which the binary photomask 100 is loaded, most of light 202 irradiating the frame light-blocking patterns 128 in the frame region 120 may be blocked from reaching the positive tone resist layer formed on the wafer. Meanwhile, the light 202 irradiating the first and second frame exposure regions 129-1 and 129-2 in the frame region 120 may penetrate the light transmission substrate 102 and may exit out of the light transmission substrate 102 through the top surface 102a of the light transmission substrate 102. The light 202 exiting out of the first and second frame exposure regions 129-1 and 129-2 may or may not irradiate the positive tone resist layer formed on the wafer.

For example, if the first and second frame exposure regions 129-1 and 129-2 are designed to have widths that are narrower than a certain value, such that the light exiting out of the first and second frame exposure regions 129-1 and 129-2 has a low intensity, the light exiting out of the first and second frame exposure regions 129-1 and 129-2 does not change a chemical structure of the exposed portions of the positive tone resist layer. Accordingly, exposed portions of the positive tone resist layer may not be dissolved by a developer even though the light 202 exiting out of the first and second frame exposure regions 129-1 and 129-2 irradiates the positive tone resist layer. Alternatively, if the first and second frame exposure regions 129-1 and 129-2 may each have a predetermined width, such that the light exiting out of the first and second frame exposure regions 129-1 and 129-2 may be diffracted, the diffracted light may not irradiate the positive tone resist layer. In either case, undesired patterns corresponding to the first and second exposure regions 129-1 and 129-2 may not be transferred onto the positive tone resist layer formed on the wafer.

As compared with a case in which an entire portion of the frame region 120 is fully covered with a light-blocking layer, in this embodiment, an amount of the light absorbed into the binary photomask 100 may be reduced by at least an amount of the light penetrating the light transmission substrate 102 in the first and second frame exposure regions 129-1 and 129-2. This may reduce thermal stress of the binary photomask 100 that is due to heat generated by the light absorbed into the binary photomask 100. As a result, deformation of the binary photomask 100 may be suppressed, thus substantially preventing positions or shapes of the overlay patterns in the binary photomask 100 from being changed. In particular, the overlay patterns are generally disposed in the frame region. Thus, if the frame region 120 illustrated in FIGS. 4 and 5 is employed in photomasks, an overlay accuracy may be improved because deformation of the overlay patterns in the photomasks may be suppressed.

Figure 6:
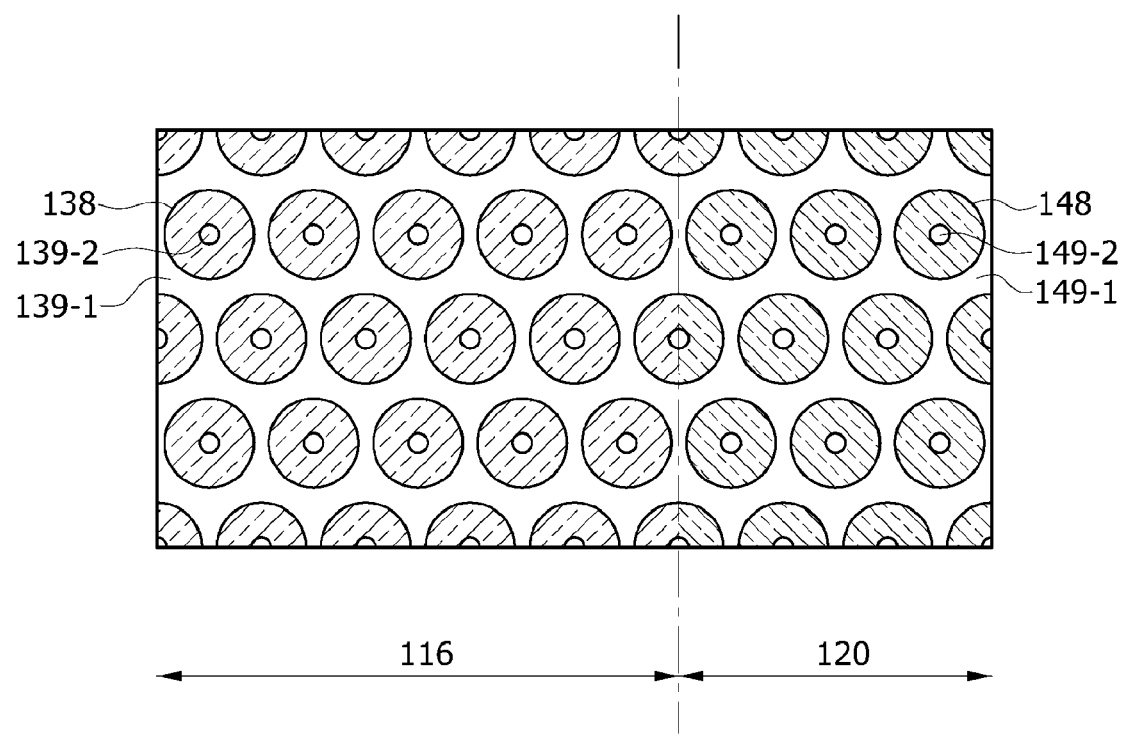
FIG. 6 is a plan view illustrating a light-blocking region in a transfer region and a frame region included in the binary photomask shown in FIG. 1 according to an embodiment.
Figure 7:
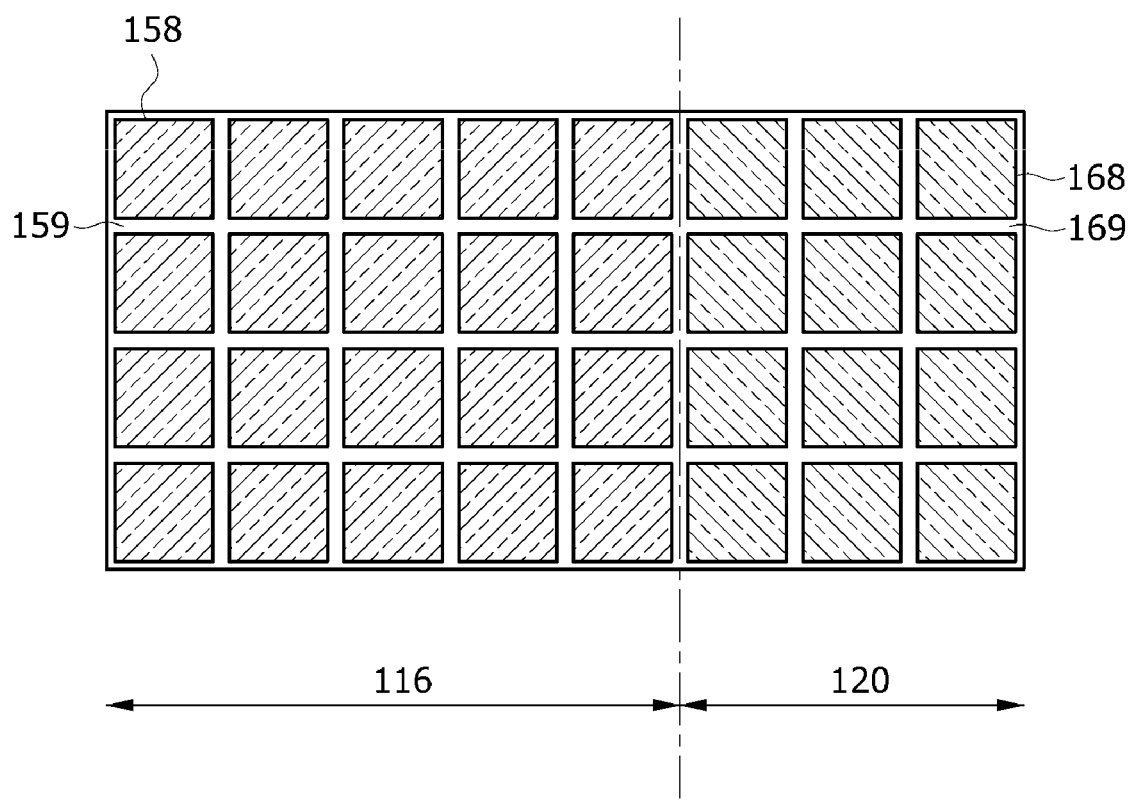
FIG. 7 is a plan view illustrating a light-blocking region in a transfer region and a frame region included in the binary photomask shown in FIG. 1 according to another embodiment.
Figure 8:
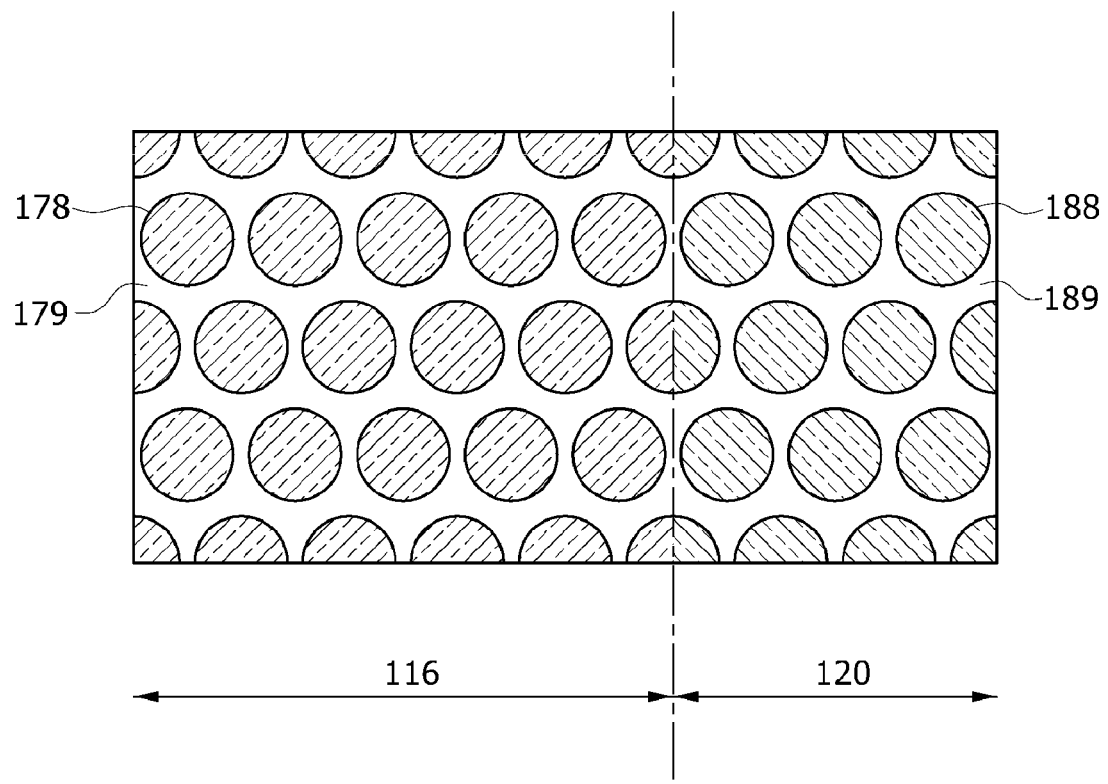
FIG. 8 is a plan view illustrating a light-blocking region in a transfer region and a frame region included in the binary photomask shown in FIG. 1 according to still another embodiment.

FIGS. 6, 7 and 8 are plan views illustrating the light-blocking region 116 and the frame region 120 included in the binary photomask 100 shown in FIG. 1 according to various embodiments. As illustrated in FIG. 6, each of second light-blocking patterns 138 disposed in the light-blocking region 116 and each of frame light-blocking patterns 148 disposed in the frame region 120 may have a circular closed loop shape (i.e., an annular shape). That is, each of the second light-blocking patterns 138 and the frame light-blocking patterns 148 may have an opening that penetrates a central portion thereof. Accordingly, portions of the top surface (102a of FIG. 3) of the light transmission substrate (102 of FIG. 3) may be exposed by the openings of the second light-blocking patterns 138 and the openings of the frame light-blocking patterns 148. An exposed portion of the light transmission substrate 102 between the second light-blocking patterns 138 may be a first exposure region 139-1, and portions of the light transmission substrate 102 exposed by the openings of the second light-blocking patterns 138 may be second exposure regions 139-2. Similarly, an exposed portion of the light transmission substrate 102 between the frame light-blocking patterns 148 may be a first frame exposure region 149-1, and portions of the light transmission substrate 102 exposed by the openings of the frame light-blocking patterns 148 may be second frame exposure regions 149-2.

As illustrated in FIG. 7, each of second light-blocking patterns 158 disposed in the light-blocking region 116 and each of frame light-blocking patterns 168 disposed in the frame region 120 may have a rectangular shape. An exposed portion of the light transmission substrate 102 between the second light-blocking patterns 158 may be a first exposure region 159, and an exposed portion of the light transmission substrate 102 between the frame light-blocking patterns 168 may be a first frame exposure region 169.

As illustrated in FIG. 8, each of second light-blocking patterns 178 disposed in the light-blocking region 116 and each of frame light-blocking patterns 188 disposed in the frame region 120 may have a circular shape. In order to minimize a planar area of a space between the second light-blocking patterns 178, the second light-blocking patterns 178 may be arrayed on the first surface 102a of the light transmission substrate 102 such that each of the second light-blocking patterns 178 is disposed in a space surrounded by six of the second light-blocking patterns 178. Similarly, the frame light-blocking patterns 188 may be arrayed on the first surface 102a of the light transmission substrate 102 such that each of the frame light-blocking patterns 188 is disposed in a space surrounded by six of the frame light-blocking patterns 188. That is, the second light-blocking patterns 178 and the frame light-blocking patterns 188 may be located at central points and vertices of a plurality of hexagons constituting a honeycomb structure, as illustrated in FIG. 8. An exposed portion of the light transmission substrate 102 between the second light-blocking patterns 178 may be a first exposure region 179, and another exposed portion of the light transmission substrate 102 between the frame light-blocking patterns 188 may be a first frame exposure region 189. In some embodiments, each of the second light-blocking patterns 178 and the frame light-blocking patterns 188 may have a hexagonal shape. The second light-blocking patterns 178 and the frame light-blocking patterns 188 having the hexagonal shape may be disposed in the same array structure as illustrated in FIG. 8.

Figure 9:
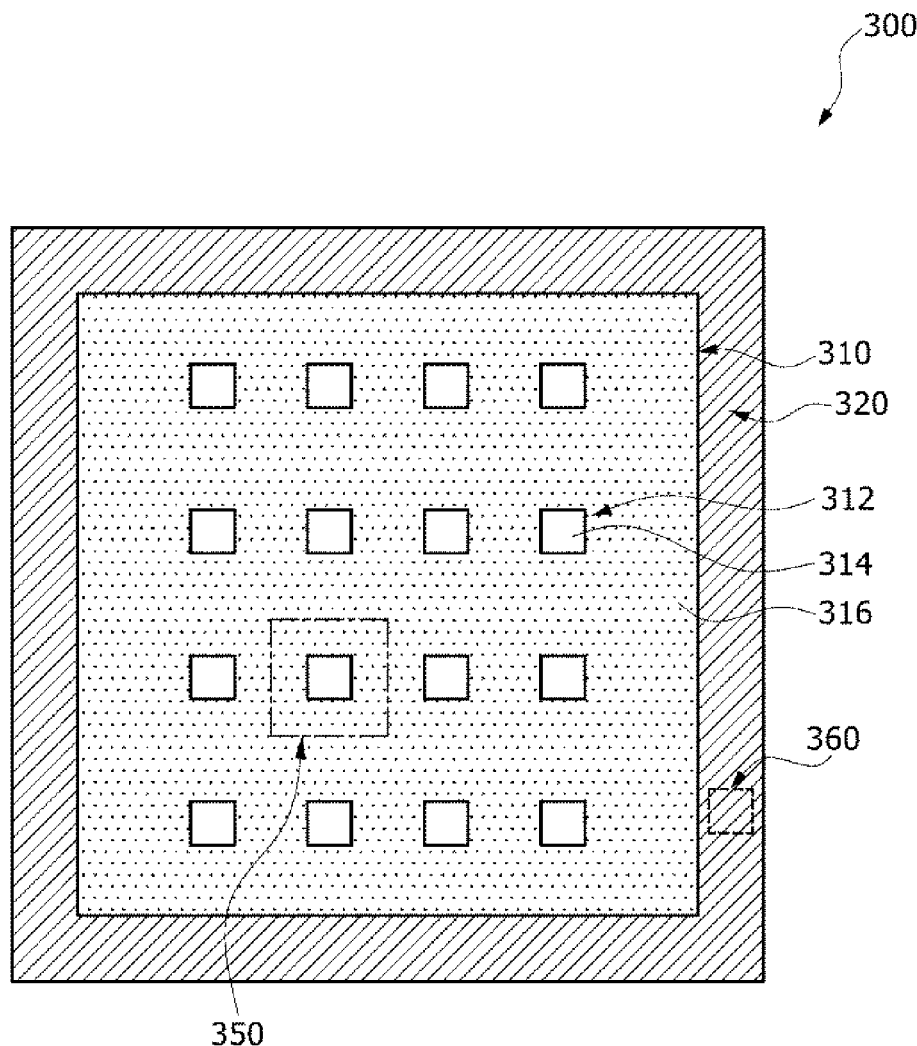
FIG. 9 is a plan view illustrating a phase shift photomask according to an embodiment.

FIG. 9 is a plan view illustrating a phase shift photomask 300 according to an embodiment. In FIG. 9, a configuration for relieving thermal stress of the phase shift photomask 300 according to the present embodiment is not illustrated in order to reduce the complexity of the drawing. The configuration for relieving the thermal stress of the phase shift photomask 300 according to the present embodiment will be described in detail with reference to FIGS. 10 to 13. In addition, various configurations for relieving thermal stress of photomasks according to other embodiments will be described in detail with reference to FIGS. 14 to 16.

Referring to FIG. 9, the phase shift photomask 300 may have a transfer region 310 and a frame region 320 surrounding the transfer region 310. The transfer region 310 may correspond to a region in which patterns configured to be transferred onto a wafer are disposed. The frame region 320 may correspond to a marginal region which is provided to prevent process errors that are due to double exposures between two adjacent shot areas (e.g., two adjacent chip areas) defined in an exposure step. A plurality of transfer patterns 312 may be disposed in the transfer region 310. The plurality of transfer patterns 312 may be two-dimensionally arrayed in rows and columns and spaced apart from each other. In the present embodiment, the plurality of transfer patterns 312 may have a uniform size and may be uniformly spaced apart from each other. However, in some embodiments, sizes of the plurality of transfer patterns 312 may be nonuniform and/or distances between the plurality of transfer patterns 312 may be nonuniform. In either embodiment, the configuration for relieving the thermal stress of the phase shift photomask 300 according to the present embodiment may be equally applicable.

As illustrated in FIG. 9, each of the transfer patterns 312 may be a hole-shaped pattern. However, the type of the transfer patterns 312 illustrated in FIG. 9 is merely exemplary. For example, the transfer patterns 312 can be line patterns spaced apart from each other instead of hole-shaped patterns. Although FIG. 9 illustrates an example in which each of the transfer patterns 312 has a rectangular shape, embodiments are not limited thereto. In some embodiments, the transfer patterns 312 may have non-rectangular shapes. Each of the transfer patterns 312 may correspond to a light-transmitting region 314 which is comprised of a portion of a light transmission substrate exposed by an opening in a phase shift region 316. That is, the transfer region 310 may include the light-transmitting regions 314 corresponding to the transfer patterns 312 and the phase shift region 316 surrounding the light-transmitting regions 314 in a plan view. A configuration of the phase shift region 316 will be described more fully with reference to FIGS. 10 and 11, which illustrate in detail a portion 350 of the transfer region 310 included in the phase shift photomask 300. A light-blocking pattern such as a chromium (Cr) pattern may be disposed in the frame region 320. Thus, the frame region 320 may substantially block light during an exposure step.

The transfer patterns 312 disposed in the transfer region 310 may be transferred onto a wafer by an exposure step. In particular, the transfer patterns 312 corresponding to the light-transmitting regions 314 may be transferred onto a positive tone resist layer formed on the wafer. Specifically, if the exposure step is performed with the phase shift photomask 300, portions of the positive tone resist layer that correspond to the transfer patterns 312 may be exposed to light passing through the transfer patterns 312 disposed in the transfer region 310 of the phase shift photomask 300. Light passing through the phase shift region 316 may have an intensity of about 5% to 8% of the intensity of the light passing through the transfer patterns 312, and the light passing through the phase shift region 316 may irradiate a portion of the positive tone resist layer that corresponds to the phase shift region 316. The light passing through the phase shift region 316 may have a phase difference of about 180 degrees, as compared with the light passing through the transfer patterns 312. As a result, only the portions of the positive tone resist layer that correspond to the transfer patterns 312 may be chemically changed and may be selectively dissolved by a developer.

Figure 10:
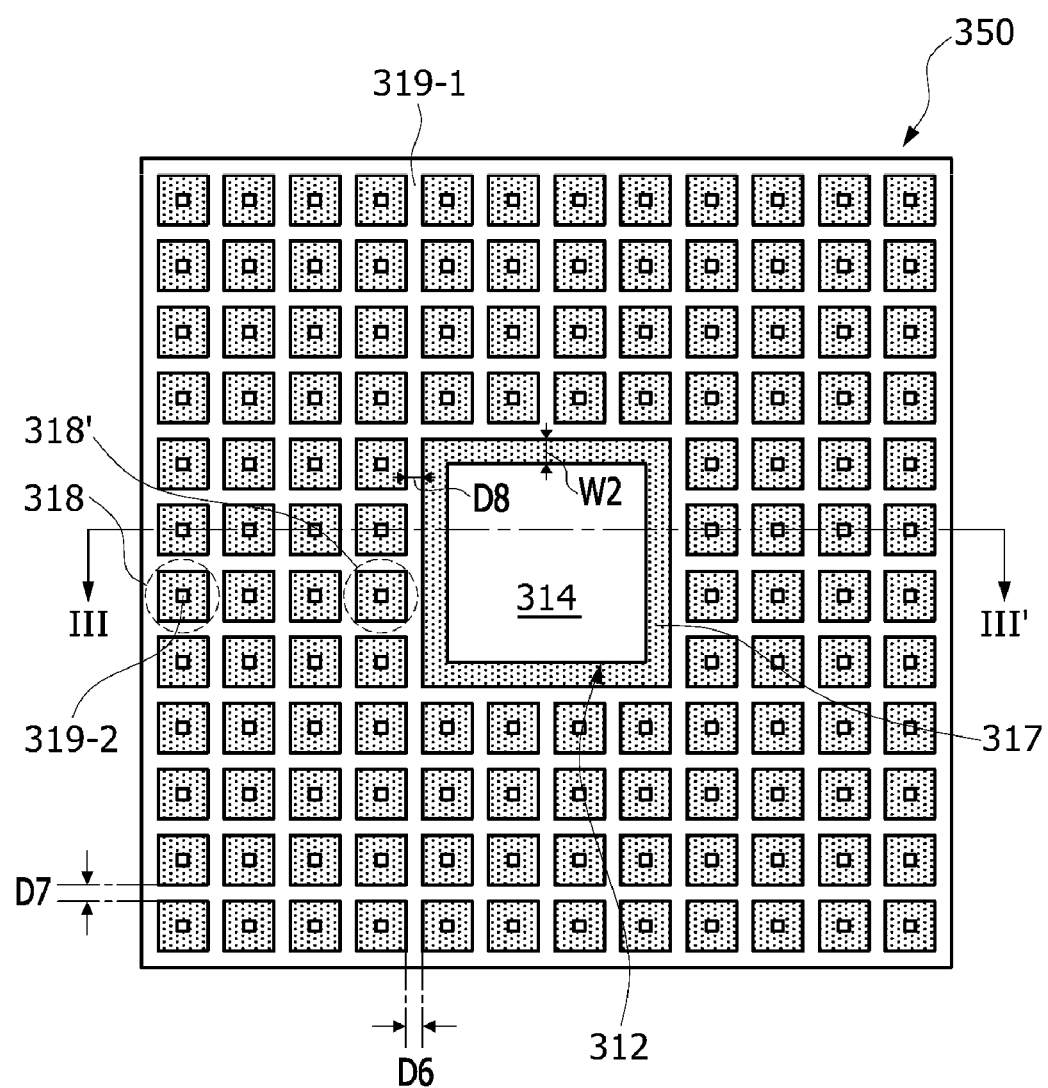
FIG. 10 is an enlarged view illustrating a portion of a transfer region of the phase shift photomask shown in FIG. 9.
Figure 11:
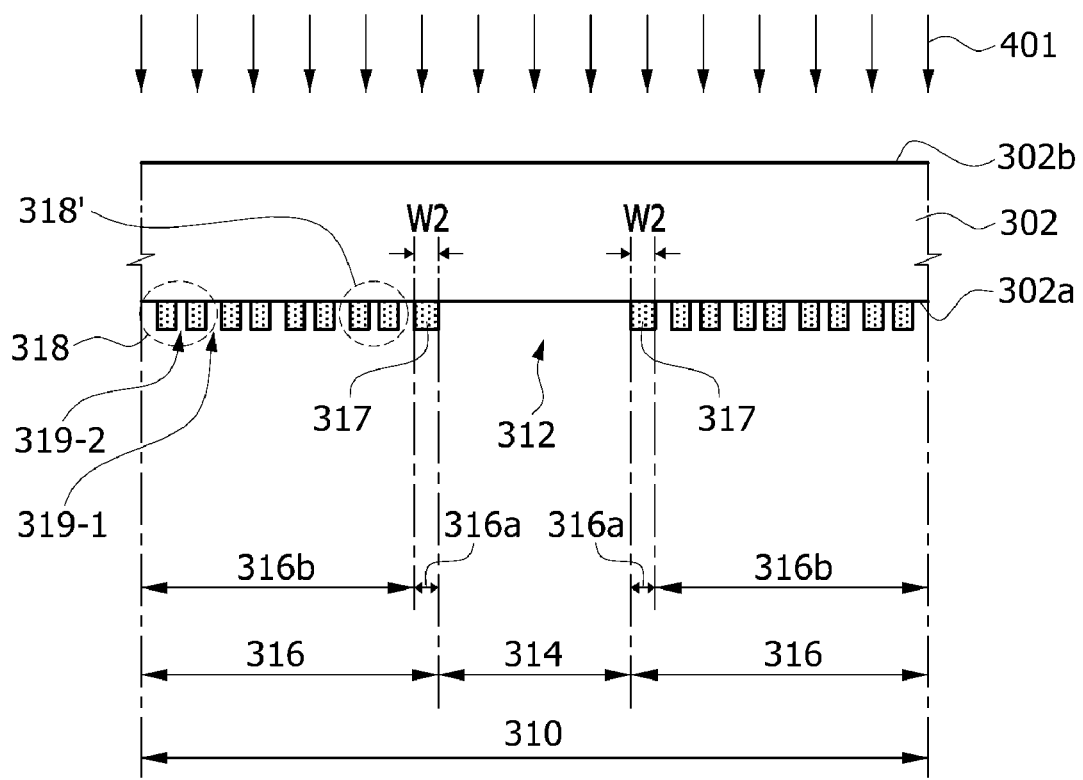
FIG. 11 is a cross-sectional view taken along a line III-III' of FIG. 10.

FIG. 10 is an enlarged view illustrating a portion 350 of the transfer region 310 of the phase shift photomask 300 shown in FIG. 9, and FIG. 11 is a cross-sectional view taken along a line III-III' of FIG. 10. In FIGS. 10 and 11, the same reference numerals as used in FIG. 9 denote the same elements. Referring to FIGS. 9, 10 and 11, the transfer patterns 312 may correspond to the light-transmitting regions 314, which are comprised of portions of a light transmission substrate 302 that are exposed in the transfer region 310. The light-transmitting regions 314 may be surrounded by the phase shift region 316. A top surface 302a of the light transmission substrate 302 in each light-transmitting region 314 may be exposed. Thus, during the exposure step, the light irradiating a bottom surface 302b of the light transmission substrate 302 may penetrate the light transmission substrate 302 in the light-transmitting region 314 to reach a wafer through the top surface 302a of the light transmission substrate 302 and a lens module of an exposure system.

The phase shift region 316 surrounding the light-transmitting regions 314 may include a plurality of first phase shift regions 316a and a second phase shift region 316b. Each of the first phase shift regions 316a may have a uniform width W4 along a perimeter of a corresponding one of the light-transmitting regions 314 and surround the corresponding light-transmitting region 314. In each of the first phase shift regions 316a, a first phase shift pattern 317 may be disposed on the top surface 302a of the light transmission substrate 302. The second phase shift region 316b may correspond to a region between the first phase shift regions 316a in the phase shift region 316. That is, the transfer region 310 may include the light-transmitting regions 314 corresponding to the transfer patterns 312, the first phase shift regions 316a surrounding the light-transmitting regions 314, and the second phase shift region 316b surrounding the first phase shift regions 316a.

A plurality of second phase shift patterns 318 may be two-dimensionally arrayed along rows and columns in the second phase shift region 316b and spaced apart from each other in a plan view. The top surface 302a of the light transmission substrate 302 may be exposed between the second phase shift patterns 318. In the present embodiment, the exposed portion of the light transmission substrate 302 between the second phase shift patterns 318 may be a first exposure region 319-1. A distance D6 between the second phase shift patterns 318 arrayed in each row may be substantially equal to a distance D7 between the second phase shift patterns 318 arrayed in each column. The second phase shift patterns 318 may include second phase shift patterns 318' disposed directly adjacent to each of the first phase shift patterns 317. A distance D8 between the first phase shift pattern 317 and any one of the second phase shift patterns 318' may be substantially equal to the distance D6 between the second phase shift patterns 318 arrayed in each row and the distance D7 between the second phase shift patterns 318 arrayed in each column. The second phase shift patterns 318 may be located at cross points of the rows and the columns. That is, the second phase shift patterns 318 may be two-dimensionally arrayed in a matrix form.

Each of the second phase shift patterns 318 may have a rectangular closed loop shape. That is, each of the second phase shift patterns 318 may have an opening that penetrates a central portion thereof. Accordingly, portions of the top surface 302a of the light transmission substrate 302 may be exposed by the openings of the second phase shift patterns 318. In the present embodiment, the portions of the light transmission substrate 302 exposed by the openings of the second phase shift patterns 318 may be second exposure regions 319-2. Thus, the phase shift region 316 in the transfer region 310 may include light-blocking regions covered with the first and second phase shift patterns 317 and 318 and light-transmitting regions comprised of the first and second exposure regions 319-1 and 319-2.

If an exposure step is performed with an exposure system in which the phase shift photomask 300 is loaded, light 401 irradiating the bottom surface 302b of the light transmission substrate 302 may penetrate the light transmission substrate 302 and may exit out of the light transmission substrate 302 through the top surface 302a of the light transmission substrate 302. The light 401 exiting out of the light transmission substrate 302 may irradiate a positive tone resist layer formed on a wafer through a lens module of the exposure system. Since the light 401 penetrating the light-transmitting regions 314 irradiates the positive tone resist layer formed on the wafer, the transfer patterns 312 may be transferred onto the positive tone resist layer. The light passing through the first and second phase shift patterns 317 and 318 may have an intensity of about 5% to 8% of the intensity of the light passing through the transfer patterns 312, and the light passing through the first and second phase shift patterns 317 and 318 may have a phase difference of about 180 degrees, as compared with the light passing through the transfer patterns 312.

Meanwhile, most of the light 401 irradiating the first and second exposure regions 319-1 and 319-2 in the phase shift region 316 may penetrate the light transmission substrate 302 and may exit out of the light transmission substrate 302 through the top surface 302a of the light transmission substrate 302. However, the first and second exposure regions 319-1 and 319-2 may have widths that are narrower than a resolution limit of the exposure system. Thus, undesired patterns corresponding to the first and second exposure regions 319-1 and 319-2 may not be transferred to the positive tone resist layer formed on the wafer, and the light 401 exiting out of the first and second exposure regions 319-1 and 319-2 may not influence the transfer of the transfer patterns 312 corresponding to the light-transmitting regions 314.

According to the above embodiment, an amount of the light absorbed into the phase shift photomask 300 may be reduced by at least an amount of the light penetrating the light transmission substrate 302 in the first and second exposure regions 319-1 and 319-2, as compared to a case in which an entire portion of the phase shift region 316 is fully covered with a phase shift layer. This may reduce thermal stress of the phase shift photomask 300 that is due to heat generated by the light absorbed into the phase shift photomask 300 during an exposure step. As a result, deformation of the phase shift photomask 300 may be suppressed, thus substantially preventing positions or shapes of overlay patterns in the phase shift photomask 300 from being changed.

Figure 12:
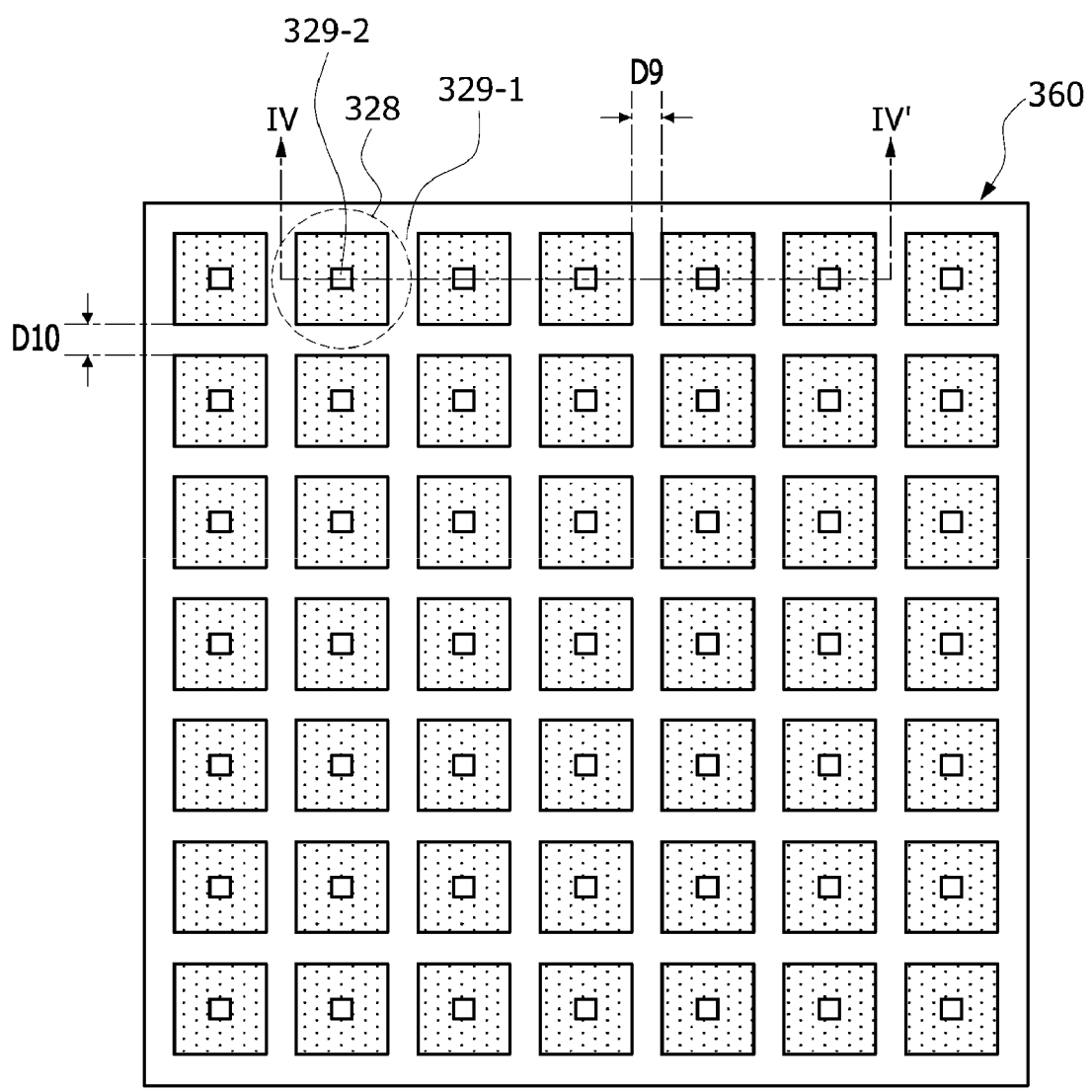
FIG. 12 is an enlarged view illustrating a portion of a frame region of the phase shift photomask shown in FIG. 9.
Figure 13:
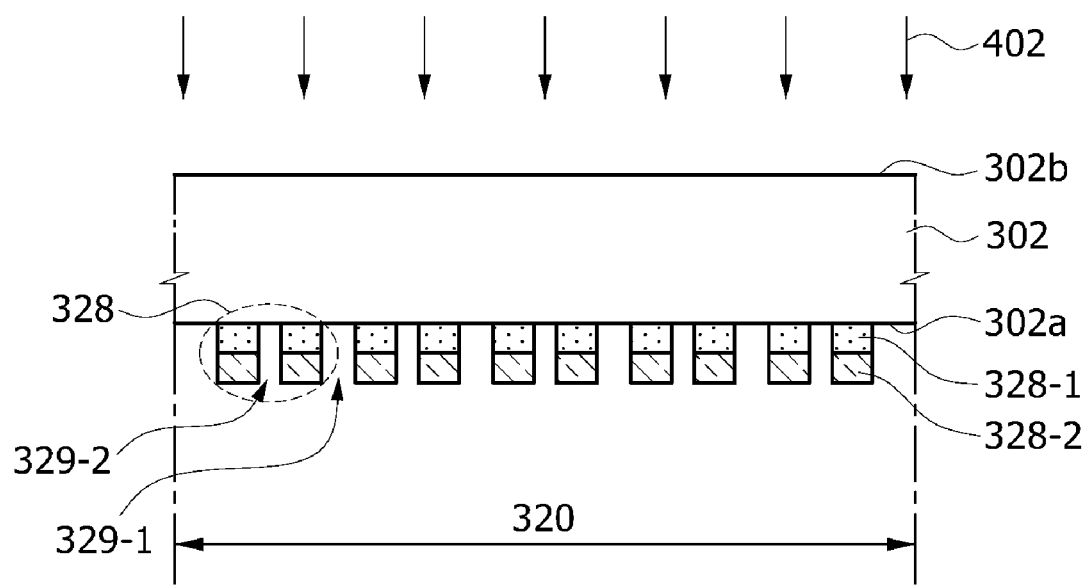
FIG. 13 is a cross-sectional view taken along a line IV-IV' of FIG. 12.

FIG. 12 is an enlarged view illustrating a portion 360 of the frame region 320 of the phase shift photomask 300 shown in FIG. 9, and FIG. 13 is a cross-sectional view taken along a line IV-IV' of FIG. 12. In FIGS. 12 and 13, the same reference numerals as used in FIG. 9 denote the same elements. Referring to FIGS. 9, 12 and 13, a plurality of frame light-blocking patterns 328 may be two-dimensionally arrayed on the top surface 302a of the light transmission substrate 302 and spaced apart from each other. That is, the plurality of frame light-blocking patterns 328 may be disposed in rows and columns in a plan view. Each of the frame light-blocking patterns 328 may include a phase shift pattern 328-1 and a light-blocking pattern 328-2 which are sequentially stacked on the top surface 302a of the light transmission substrate 302. The top surface 302a of the light transmission substrate 302 may be exposed between the frame light-blocking patterns 328. In the present embodiment, the exposed portion of the light transmission substrate 302 between the frame light blocking patterns 328 may be a first frame exposure region 329-1. A distance D9 between the frame light-blocking patterns 328 arrayed in each row may be substantially equal to a distance D10 between the frame light-blocking patterns 328 arrayed in each column. These distances D9 and D10 may be substantially equal to the distance D6 between the second phase shift patterns 318 arrayed in each row and the distance D7 between the second light-blocking patterns 318 arrayed in each column which are described with reference to FIGS. 10 and 11. The frame light-blocking patterns 328 may be located at cross points of the rows and the columns. That is, the frame light-blocking patterns 328 may be two-dimensionally arrayed in a matrix form.

Each of the frame light-blocking patterns 328 may have a rectangular closed loop shape. That is, each of the frame light-blocking patterns 328 may have an opening that penetrates a central portion thereof. Accordingly, portions of the top surface 302a of the light transmission substrate 302 may be exposed by the openings of the frame light-blocking patterns 328. In the present embodiment, the portions of the light transmission substrate 302 exposed by the openings of the frame light-blocking patterns 328 may be second frame exposure regions 329-2. Thus, the frame region 320 may include light-blocking regions covered with the frame light-blocking patterns 328 and light-transmitting regions comprised of the first and second frame exposure regions 329-1 and 329-2.

If an exposure step is performed with the exposure system in which the phase shift photomask 300 is loaded, most of light 402 irradiating the frame light-blocking patterns 328 in the frame region 320 may be blocked from reaching the positive tone resist layer formed on the wafer. Meanwhile, the light 402 irradiating the first and second frame exposure regions 329-1 and 329-2 in the frame region 320 may penetrate the light transmission substrate 302 and may exit out of the light transmission substrate 302 through the top surface 302a of the light transmission substrate 302. The light 402 exiting out of the first and second frame exposure regions 329-1 and 329-2 may or may not irradiate the positive tone resist layer formed on the wafer.

For example, if the first and second frame exposure regions 329-1 and 329-2 are designed to have widths that are narrower than a certain value, such that the light exiting out of the first and second frame exposure regions 329-1 and 329-2 has a low intensity, the light exiting out of the first and second frame exposure regions 329-1 and 329-2 does not change a chemical structure of exposed portions of the positive tone resist layer. Accordingly, the exposed portions of the positive tone resist layer may not be dissolved by a developer even though the light 402 exiting out of the first and second frame exposure regions 329-1 and 329-2 irradiates the positive tone resist layer.

Alternatively, if the first and second frame exposure regions 329-1 and 329-2 may have a predetermined width, so that the light exiting out of the first and second frame exposure regions 329-1 and 329-2 may be diffracted, the diffracted light may not irradiate the positive tone resist layer. In either embodiment, undesired patterns corresponding to the first and second exposure regions 329-1 and 329-2 may not be transferred onto the positive tone resist layer formed on the wafer.

As compared to a case in which an entire portion of the frame region 320 is fully covered with a light-blocking layer, in this embodiment, an amount of the light absorbed into the phase shift photomask 300 may be reduced by at least an amount of the light penetrating the light transmission substrate 302 in the first and second frame exposure regions 329-1 and 329-2. This may reduce thermal stress of the phase shift photomask 300 that is due to heat generated by the light absorbed into the phase shift photomask 300. As a result, deformation of the phase shift photomask 300 may be suppressed, thus substantially preventing positions or shapes of the overlay patterns in the phase shift photomask 300 from being changed. In particular, the overlay patterns are generally disposed in the frame region. Thus, if the frame region 320 illustrated in FIGS. 12 and 13 is employed in photomasks, an overlay accuracy may be improved because deformation of the overlay patterns in the photomasks may be suppressed.

Figure 14:
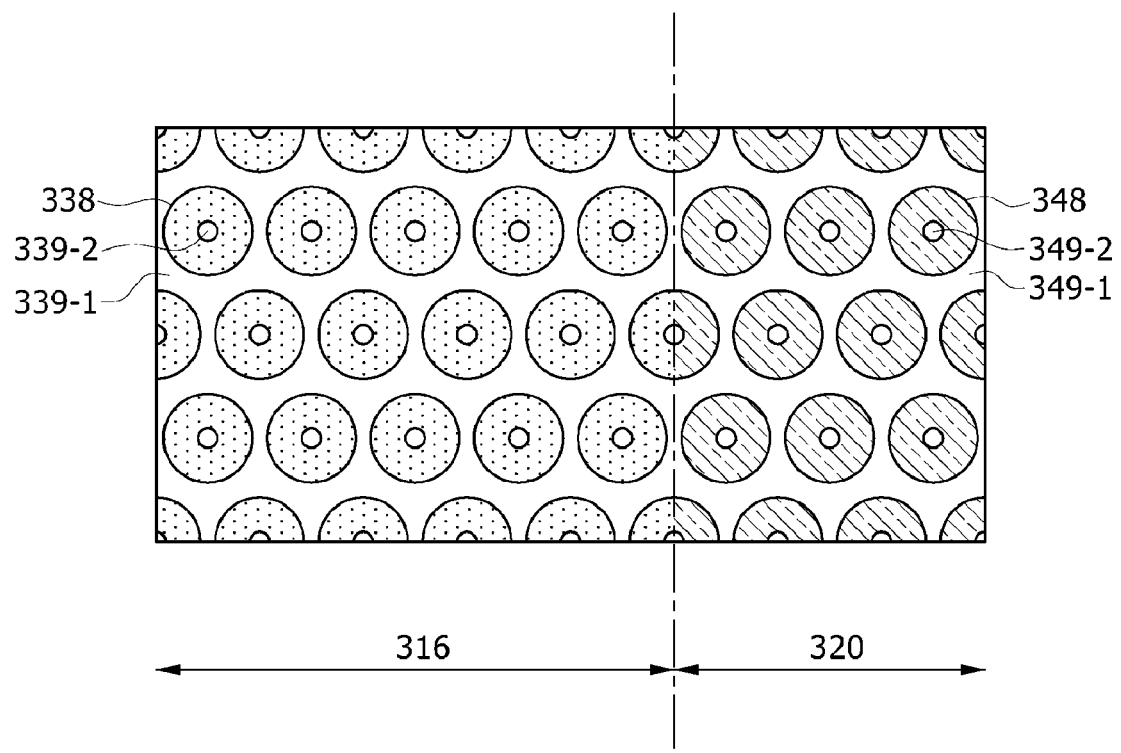
FIG. 14 is a plan view illustrating a phase shift region in a transfer region and a frame region included in the phase shift photomask shown in FIG. 9 according to an embodiment.
Figure 15:
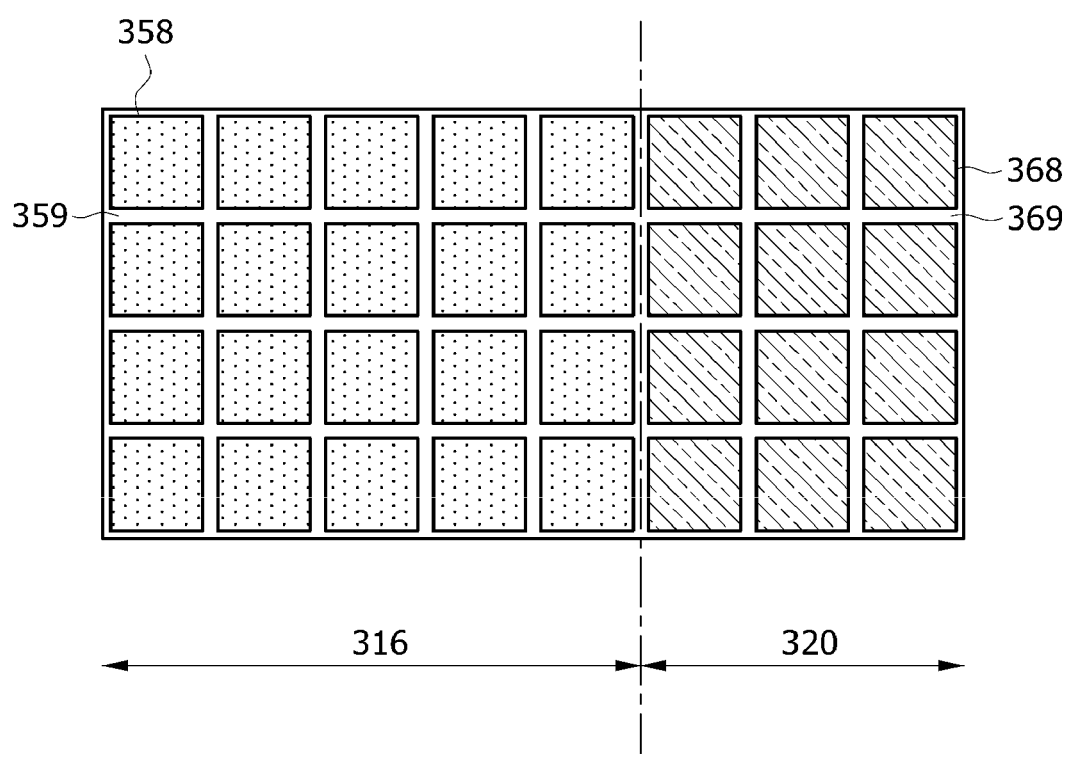
FIG. 15 is a plan view illustrating a phase shift region in a transfer region and a frame region included in the phase shift photomask shown in FIG. 9 according to another embodiment.
Figure 16:
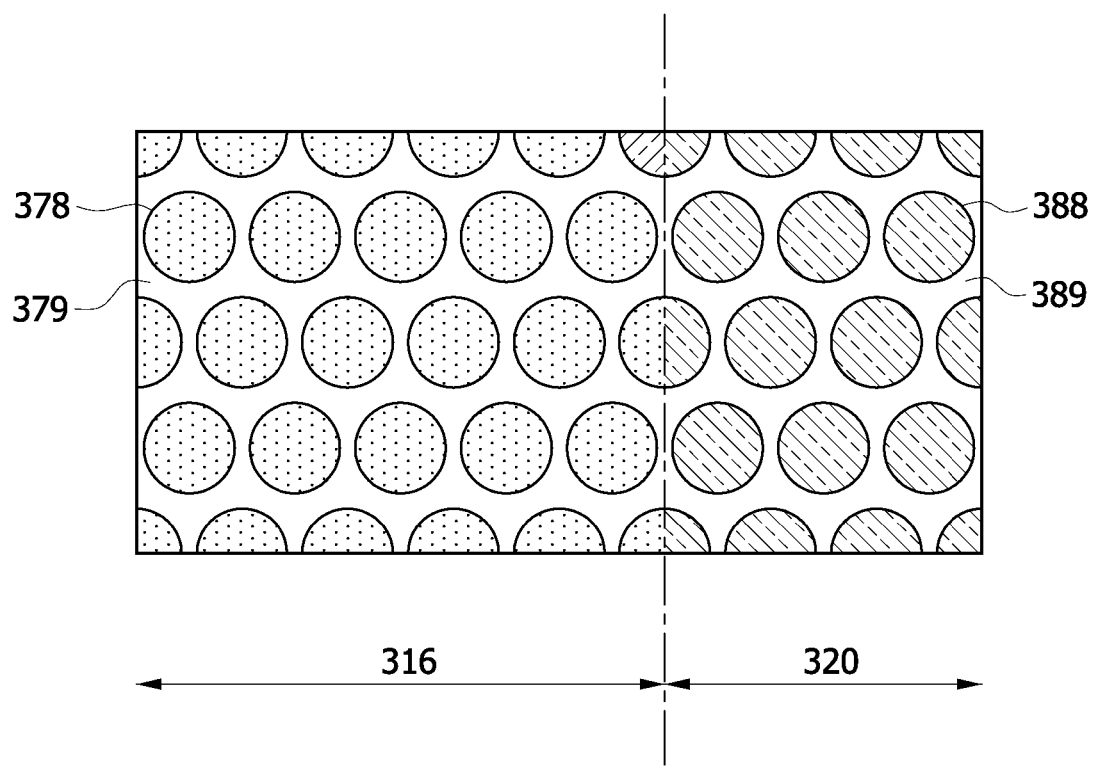
FIG. 16 is a plan view illustrating a phase shift region in a transfer region and a frame region included in the phase shift photomask shown in FIG. 9 according to still another embodiment.

FIGS. 14, 15 and 16 are plan views illustrating the phase shift region 316 and the frame region 320 included in the phase shift photomask 300 shown in FIG. 9 according to various embodiments. As illustrated in FIG. 14, each of second phase shift patterns 338 disposed in the phase shift region 316 and each of frame light-blocking patterns 348 disposed in the frame region 320 may have a circular closed loop shape (i.e., an annular shape). That is, each of the second phase shift patterns 338 and the frame light-blocking patterns 348 may have an opening that penetrates a central portion thereof. Accordingly, portions of the top surface (302a of FIG. 11) of the light transmission substrate (302 of FIG. 11) may be exposed by the openings of the second phase shift patterns 338 and the frame light-blocking patterns 348. An exposed portion of the light transmission substrate 302 between the second phase shift patterns 338 may be a first exposure region 339-1, and portions of the light transmission substrate 302 exposed by the openings of the second phase shift patterns 338 may be second exposure regions 339-2. Similarly, an exposed portion of the light transmission substrate 302 between the frame light-blocking patterns 348 may be a first frame exposure region 349-1, and portions of the light transmission substrate 302 exposed by the openings of the frame light-blocking patterns 348 may be second frame exposure regions 349-2.

As illustrated in FIG. 15, each of second phase shift patterns 358 disposed in the phase shift region 316 and each of frame light-blocking patterns 368 disposed in the frame region 320 may have a rectangular shape. An exposed portion of the light transmission substrate 302 between the second phase shift patterns 358 may be a first exposure region 359, and an exposed portion of the light transmission substrate 302 between the frame light-blocking patterns 368 may be a first frame exposure region 369.

As illustrated in FIG. 16, each of second phase shift patterns 378 disposed in the phase shift region 316 and each of frame light-blocking patterns 388 disposed in the frame region 320 may have a circular shape. In order to minimize a planar area of a space between the second phase shift patterns 378, the second phase shift patterns 378 may be arrayed on the first surface 302a of the light transmission substrate 302 such that each of the second phase shift patterns 378 is disposed in a space surrounded by six of the second phase shift patterns 378. Similarly, the frame light-blocking patterns 388 may be arrayed on the first surface 302a of the light transmission substrate 302 such that each of the frame light-blocking patterns 388 is disposed in a space surrounded by six of the frame light-blocking patterns 388. That is, the second phase shift patterns 378 and the frame light-blocking patterns 388 may be located at central points and vertices of a plurality of hexagons constituting a honeycomb structure, as illustrated in FIG. 16. An exposed portion of the light transmission substrate 302 between the second phase shift patterns 378 may be a first exposure region 379, and another exposed portion of the light transmission substrate 302 between the frame light-blocking patterns 388 may be a first frame exposure region 389. In some embodiments, each of the second phase shift patterns 378 and the frame light-blocking patterns 388 may have a hexagonal shape. The second phase shift patterns 378 and the frame light-blocking patterns 388 having the hexagonal shape may be disposed in the same array structure as illustrated in FIG. 16.

Figure 17:
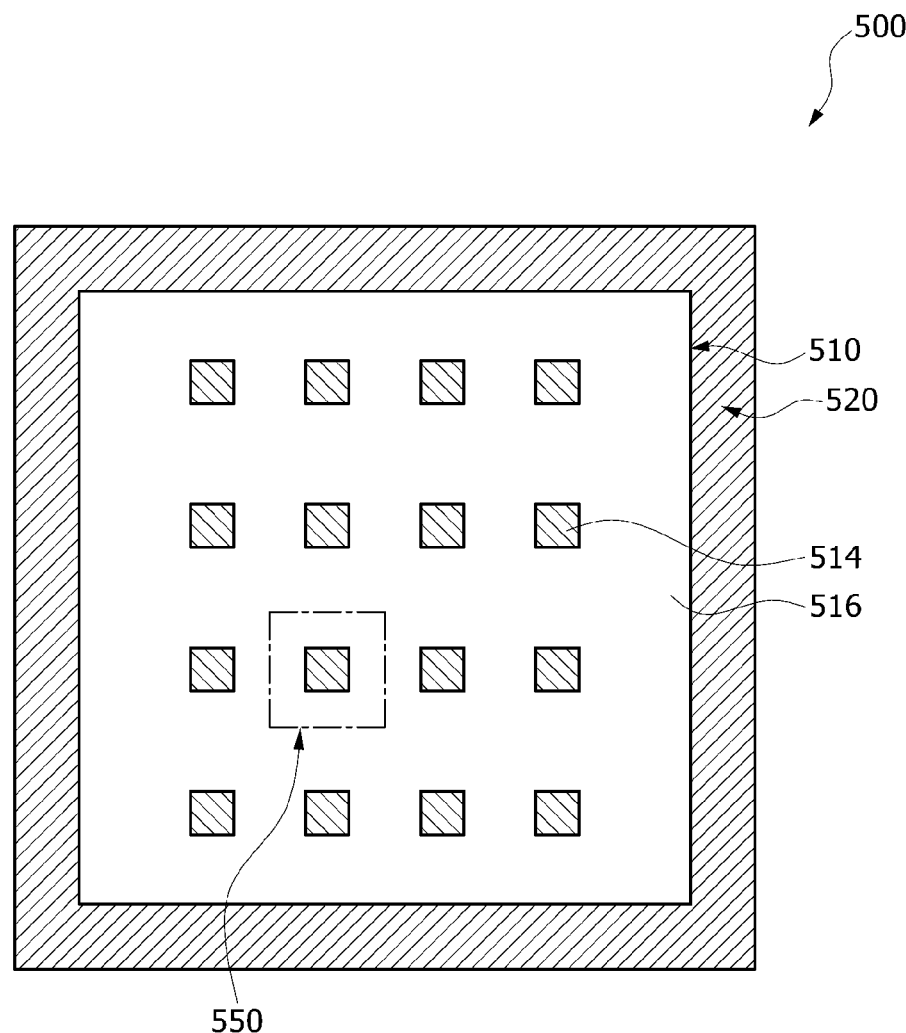
FIG. 17 is a plan view illustrating a photomask according to an embodiment.

FIG. 17 is a plan view illustrating a photomask 500 according to an embodiment. In FIG. 17, a configuration of the photomask 500 for preventing a lens (or lens module) of an exposure system from being heated is not illustrated in order to reduce the complexity of the drawing. The configuration of the photomask 500 for preventing the lens (or lens module) of the exposure system from being heated will be described in detail with reference to FIGS. 18 and 19.

Referring to FIG. 17, the photomask 500 may have a transfer region 510 and a frame region 520 surrounding the transfer region 510. The transfer region 510 may correspond to a region in which patterns configured to be transferred onto a wafer are disposed. The frame region 520 may correspond to a marginal region which is provided to prevent process errors that are due to double exposures between two adjacent shot areas (e.g., two adjacent chip areas) defined in an exposure step. A plurality of transfer patterns 514 may be disposed in the transfer region 510. The plurality of transfer patterns 514 may be two-dimensionally arrayed in rows and columns and spaced apart from each other. In the present embodiment, the plurality of transfer patterns 514 may have a uniform size and may be uniformly spaced apart from each other. However, in some embodiments, sizes of the plurality of transfer patterns 514 may be nonuniform and/or distances between the plurality of transfer patterns 514 may be nonuniform. In either embodiment, the configuration of the photomask 500 for preventing the lens (or lens module) of the exposure system from being heated may be equally applicable.

As illustrated in FIG. 17, each of the transfer patterns 514 may be a hole-shaped pattern. However, the type of the transfer patterns 514 illustrated in FIG. 17 is merely exemplary. For example, the transfer patterns 514 can be line patterns spaced apart from each other instead of hole-shaped patterns. Although FIG. 17 illustrates an embodiment in which each of the transfer patterns 514 has a rectangular shape, embodiments are not limited thereto. In some embodiments, the transfer patterns 514 may have non-rectangular shapes. Each of the transfer patterns 514 may correspond to a light-blocking pattern or a phase shift pattern. That is, the transfer region 510 may include the transfer patterns 514 such as light-blocking patterns or phase shift patterns and a light-transmitting region 516 surrounding the transfer patterns 514. The light-transmitting region 516 will be described more fully with reference to FIGS. 18 and 19, which illustrate in detail a portion 550 of the transfer region 510 included in the photomask 500. A light-blocking pattern such as a chromium (Cr) pattern may be disposed in the frame region 520. Thus, the frame region 520 may substantially block light during an exposure step.

The transfer patterns 514 disposed in the transfer region 510 may be transferred onto a wafer by an exposure step. In particular, the transfer patterns 514 corresponding to light-blocking patterns or phase shift patterns may be transferred onto a negative tone resist layer formed on the wafer. Specifically, if the exposure step is performed with the photomask 500, no light irradiates portions of the negative tone resist layer that correspond to the transfer patterns 514. In contrast, a portion of the negative tone resist layer, which corresponds to the light-transmitting region 516, may be exposed to light passing through the light-transmitting region 516. As a result of the exposure step, the exposed portions of the negative tone resist layer may be cross-linked and polymerized to have a chemical structure that is not dissolved by a developer. Thus, if the negative tone resist layer is developed after the exposure step is performed, only the non-exposed portions of the negative tone resist layer that correspond to the transfer patterns 514 may be selectively removed.

Figure 18:
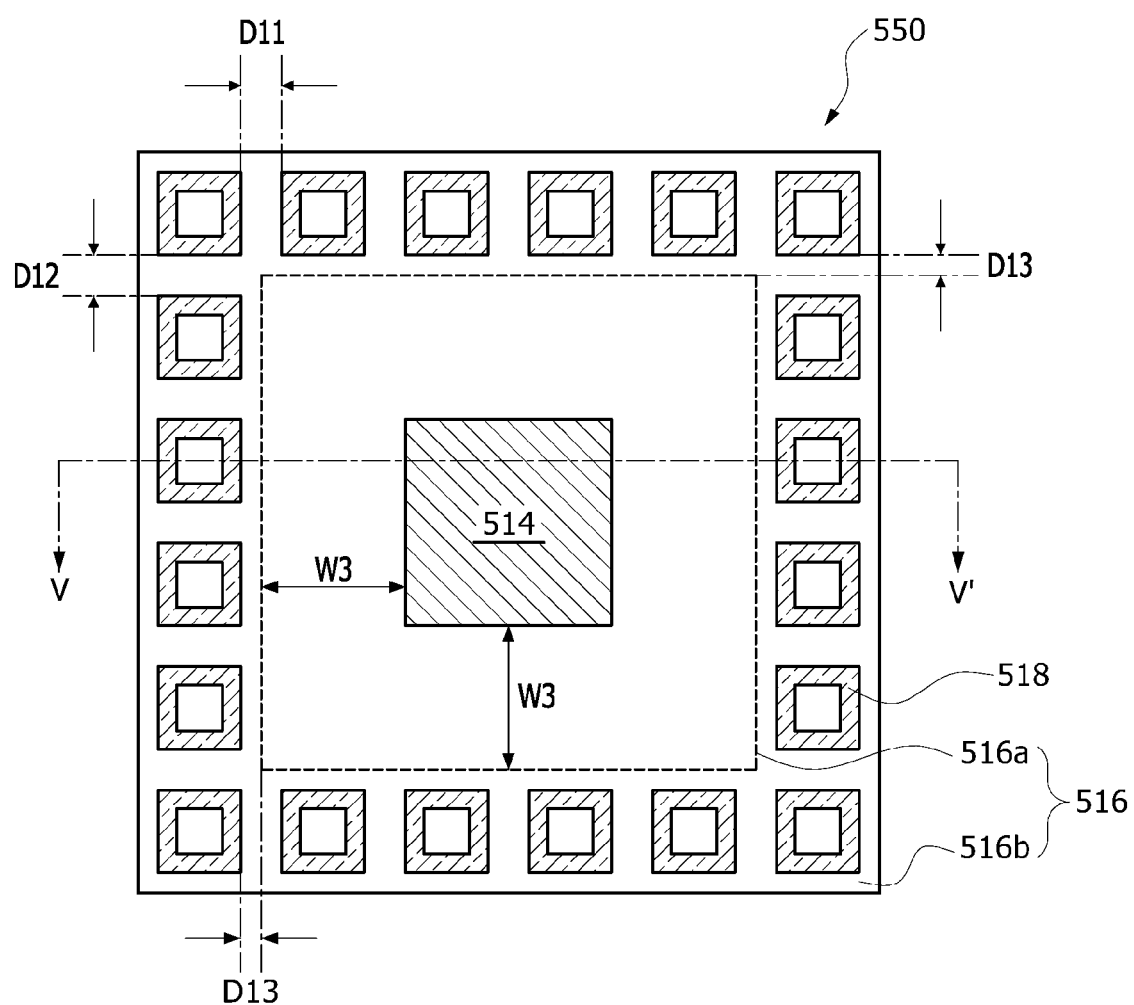
FIG. 18 is an enlarged view illustrating a portion of a transfer region of the photomask shown in FIG. 17.
Figure 19:
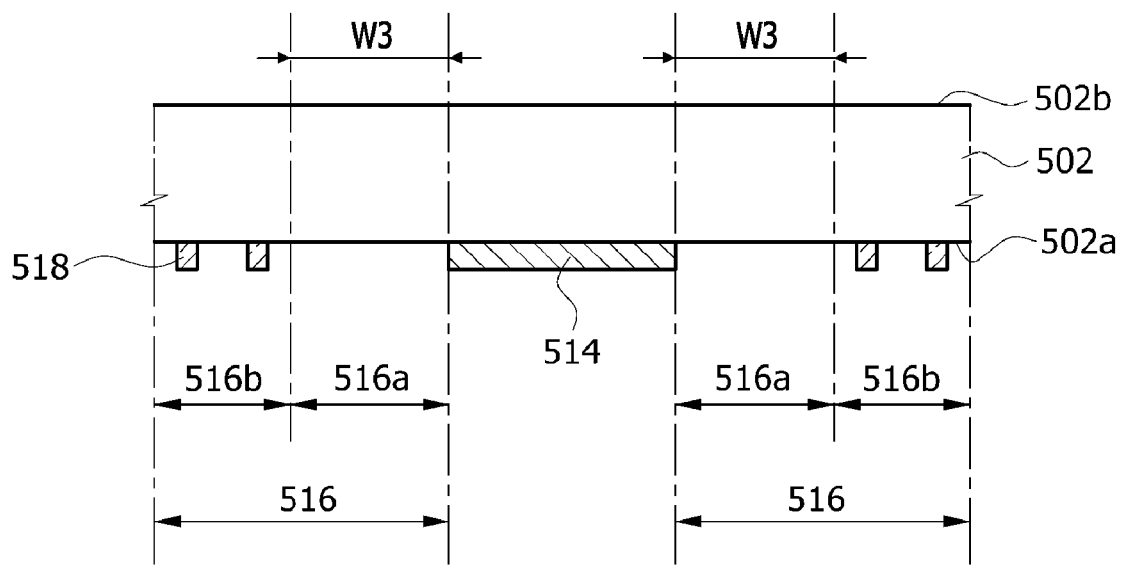
FIG. 19 is a cross-sectional view taken along a line V-V' of FIG. 18.

FIG. 18 is an enlarged view illustrating the portion 550 of the transfer region 510 of the photomask 500 shown in FIG. 17, and FIG. 19 is a cross-sectional view taken along a line V-V' of FIG. 18. In FIGS. 18 and 19, the same reference numerals as used in FIG. 17 denote the same elements. Referring to FIGS. 17, 18 and 19, the transfer patterns 514 may be disposed on a top surface 502a of a light transmission substrate 502 in the transfer region 510. The transfer patterns 514 may be surrounded by the light-transmitting region 516. The light-transmitting region 516 may correspond to a region in which the top surface 502a of the light transmission substrate 502 is exposed. Thus, during the exposure step, the light irradiating a bottom surface 502b of the light transmission substrate 502 may penetrate the light transmission substrate 502 in the light-transmitting region 516 to reach the wafer through the top surface 502a of the light transmission substrate 502 and a lens module of an exposure system.

The light-transmitting region 516 surrounding the transfer patterns 514 may include a first light-transmitting region 516a and a second light-transmitting region 516b. The first light-transmitting region 516a may have a uniform width W3 along a perimeter of the transfer pattern 514 and surround the transfer pattern 514. In the first light-transmitting region 516a, an entire portion of the top surface 502a of the light transmission substrate 502 may be fully exposed. The second light-transmitting region 516b may surround the first light-transmitting region 516a. Thus, the transfer region 510 may include the transfer patterns 514, the first light-transmitting regions 516a surrounding the transfer patterns 514, and the second light-transmitting regions 516b surrounding the first light-transmitting regions 516a.

A plurality of light-blocking patterns 518 may be two-dimensionally arrayed along rows and columns in the second light-transmitting region 516b and spaced apart from each other in a plan view. The top surface 502a of the light transmission substrate 502 may be exposed between the light-blocking patterns 518 in the second light-transmitting region 516b. A distance D11 between the light-blocking patterns 518 arrayed in each row may be substantially equal to a distance D12 between the light-blocking patterns 518 arrayed in each column. The light-blocking patterns 518 may be spaced apart from the first light-transmitting region 516a by a distance D13, and the distance D13 may be less than the distance D11 between the light-blocking patterns 518 arrayed in each row and the distance D12 between the light-blocking patterns 518 arrayed in each column. In some embodiments, the distance D13 between the first light-transmitting region 516a and the light-blocking patterns 518 may be about half the distance D11 between the light-blocking patterns 518 arrayed in each row or about half the distance D12 between the light-blocking patterns 518 arrayed in each column. The light-blocking patterns 518 may be two-dimensionally arrayed in the second light-transmitting region 516b to have a matrix form in a plan view.

Each of the light-blocking patterns 518 may have a rectangular closed loop shape. That is, each of the light-blocking patterns 518 may have an opening that penetrates a central portion thereof. A width of each side of the light-blocking patterns 518 may be narrower than a resolution limit of the exposure system. Thus, the light-blocking patterns 518 may not be transferred onto the wafer. Portions of the top surface 502a of the light transmission substrate 502 may be exposed by the openings of the light-blocking patterns 518. Thus, the light-transmitting region 516 may include the plurality of first light-transmitting regions 516a and the second light-transmitting regions 516b. The second light-transmitting region 516b may include light-transmitting regions exposed by the openings of the light-blocking patterns 518, light-blocking regions covered by the light-blocking patterns 518, and a light-transmitting region between the light-blocking patterns 518.

Figure 20:
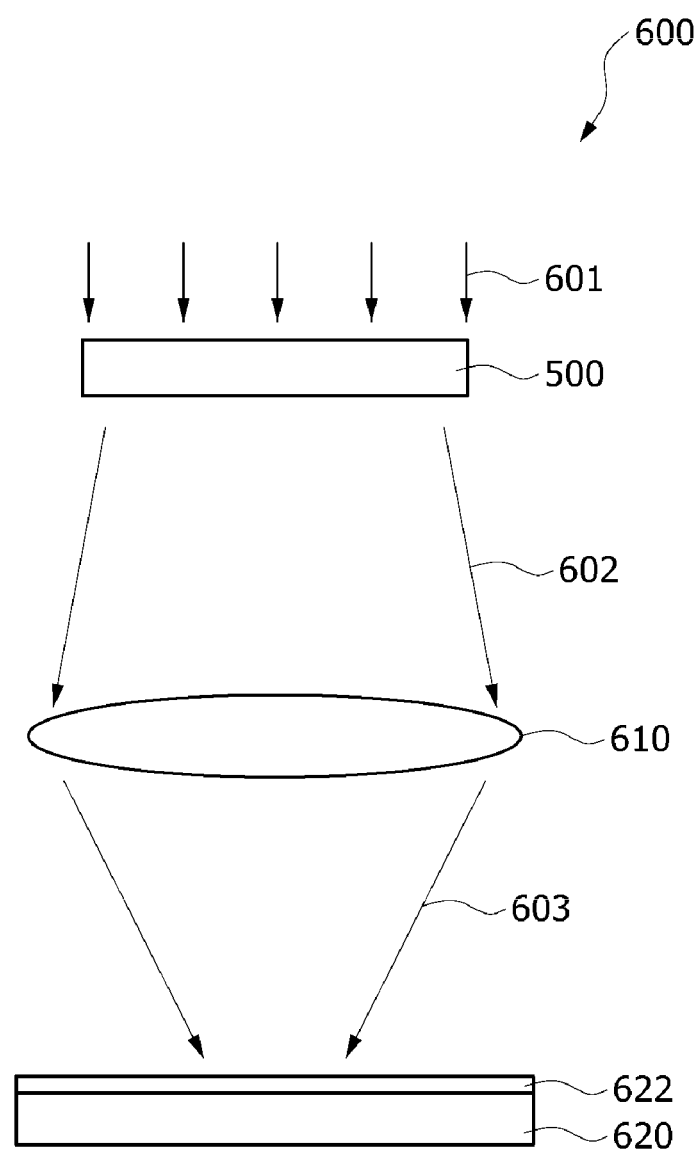
FIG. 20 is a schematic view illustrating an exposure system in which the photomask of FIG. 17 is loaded.

FIG. 20 is a schematic view illustrating an exposure system 600 in which the photomask 500 of FIG. 17 is loaded. Referring to FIG. 20, the photomask 500 may have the transfer patterns 514 corresponding to light-blocking patterns or phase shift patterns and the light-transmitting region 516 surrounding the transfer patterns 514, as described with reference to FIGS. 17, 18 and 19. The light-blocking patterns 518 having a smaller size than a resolution limit of the exposure system 600 may be disposed in the light-transmitting region 516. The photomask 500 having the aforementioned configuration may be loaded into the exposure system 600, and light 601 generated from a light source (not shown) may irradiate the photomask 500. The light 601 irradiating the photomask 500 may pass through the photomask 500 or may be blocked by the photomask 500 according to structures of patterns disposed on the photomask 500. Light passing through the photomask 500 may irradiate a lens 610 (or lens module) of the exposure system 600, as indicated by arrows 602. Light passing through the lens 610 may travel along appropriate optical paths and may reach a negative tone resist layer 622 formed on a wafer 620, as indicated by arrows 603. In general, this exposure step may be repeatedly performed to expose a plurality of chip regions included in the wafer 620. Thus, the light may be repeatedly irradiating the lens 610 while the exposure step is repeatedly performed to expose the plurality of chip regions included in the wafer 620.

Since the negative tone resist layer 622 is used as a resist layer, the light-transmitting region 516 of the photomask 500 may have a relatively large area. During a single exposure step, an amount of the light irradiating the lens 610 may increase as compared with the embodiments illustrated in FIGS. 1 to 16. As a result, thermal stress of the lens 610 may occur when it is heated, and thus the lens 610 may be deformed. As a result, an aberration of the lens 610 may be changed to degrade the quality of pattern images transferred onto the wafer 620. However, according to the present embodiments, the plurality of light-blocking patterns 518 each having a width smaller than the resolution limit of the exposure system 600 may be disposed in the light-transmitting region 516. Thus, an amount of the light irradiating the lens 610 may be reduced without transfer of patterns corresponding to the plurality of light-blocking patterns 518. Accordingly, the thermal stress of the lens 610 may be alleviated.

The embodiments of the present disclosure have been disclosed above for illustrative purposes. Those of ordinary skill in the art will appreciate that various modifications, additions, and substitutions are possible, without departing from the scope and spirit of the present disclosure as claimed below.

What is claimed is:

1. A photomask comprising:
   a light transmission substrate having a transfer region and a frame region;
   a light-transmitting region exposing a portion of the light transmission substrate in the transfer region corresponding to a transfer pattern; and
   a light-blocking region disposed in the transfer region and surrounding the light-transmitting region,
   wherein the light-blocking region includes a first light-blocking region surrounding the light-transmitting region, and a second light-blocking region that surrounds the first light-blocking region, and
   wherein a first light-blocking pattern is disposed on the light transmission substrate in the first light-blocking region, and a plurality of second light-blocking patterns are disposed on the light transmission substrate in the second light-blocking region.

2. The photomask of claim 1, wherein the first light-blocking region has a uniform width along a perimeter of the light-transmitting region.

3. The photomask of claim 1, wherein the second light-blocking patterns are spaced apart and two-dimensionally arrayed in rows and columns in the second light-blocking region.

4. The photomask of claim 3, wherein the light transmission substrate is exposed between the second light-blocking patterns.

5. The photomask of claim 3, wherein a distance between the second light-blocking patterns arrayed in each row is substantially equal to a distance between the second light-blocking patterns arrayed in each column.

6. The photomask of claim 5, wherein a distance between the first light-blocking pattern and any one of the second light-blocking patterns directly adjacent to the first light-blocking pattern is substantially equal to the distance between the second light-blocking patterns arrayed in each row or the distance between the second light-blocking patterns arrayed in each column.

7. The photomask of claim 1, wherein each of the second light-blocking patterns has a rectangular shape.

8. The photomask of claim 7, wherein the second light-blocking patterns are arrayed on the light transmission substrate in a matrix form.

9. The photomask of claim 1, wherein each of the second light-blocking patterns has a circular shape.

10. The photomask of claim 9, wherein the second light-blocking patterns are arrayed on the light transmission substrate such that one second light-blocking pattern is disposed in a space surrounded by six of the second light-blocking patterns.

11. The photomask of claim 1, wherein each of the second light-blocking patterns has a rectangular closed loop shape including an opening that penetrates a central portion of the second light-blocking pattern, the opening exposing a portion of the light transmission substrate.

12. The photomask of claim 1, wherein each of the second light-blocking patterns has a circular closed loop shape including an opening that penetrates a central portion of the second light-blocking pattern, the opening exposing a portion of the light transmission substrate.

13. The photomask of claim 1, wherein the frame region is configured to include a plurality of frame light-blocking patterns which are spaced apart and arrayed in rows and columns on the light transmission substrate.

14. The photomask of claim 13, wherein the light transmission substrate is exposed between the frame light-blocking patterns.

15. The photomask of claim 13, wherein a distance between the frame light-blocking patterns arrayed in each row is substantially equal to a distance between the frame light-blocking patterns arrayed in each column.

16. The photomask of claim 13, wherein each of the frame light-blocking patterns has a rectangular shape.

17. The photomask of claim 16, wherein the frame light-blocking patterns are arrayed on the light transmission substrate in a matrix form.

18. The photomask of claim 13, wherein each of the frame light-blocking patterns has a circular shape.

19. The photomask of claim 18, wherein the frame light-blocking patterns are arrayed on the light transmission substrate such that one frame light-blocking pattern is disposed in a space surrounded by six of the frame light-blocking patterns.

20. The photomask of claim 13, wherein each of the frame light-blocking patterns has a rectangular closed loop shape including an opening that penetrates a central portion of the frame-light blocking pattern, the opening exposing a portion of the light transmission substrate.

21. The photomask of claim 13, wherein each of the frame light-blocking patterns has a circular closed loop shape including an opening that penetrates a central portion of the frame light-blocking pattern, the opening exposing a portion of the light transmission substrate.

* * * * *